(12) United States Patent
Jeon et al.

(10) Patent No.: US 12,199,138 B2
(45) Date of Patent: Jan. 14, 2025

(54) SEMICONDUCTOR DEVICE INCLUDING CAPACITOR STRUCTURE AND METHOD FOR MANUFACTURING THE SAME

(71) Applicant: Samsung Electronics Co., Ltd., Suwon-si (KR)

(72) Inventors: Intak Jeon, Seoul (KR); Jiye Baek, Hwaseong-si (KR); Hanjin Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 312 days.

(21) Appl. No.: 17/941,688

(22) Filed: Sep. 9, 2022

(65) Prior Publication Data

US 2023/0163162 A1    May 25, 2023

(30) Foreign Application Priority Data

Nov. 22, 2021 (KR) .......................... 10-2021-0161058

(51) Int. Cl.
*H10B 12/00* (2023.01)
*H01L 49/02* (2006.01)

(52) U.S. Cl.
CPC .............. *H01L 28/75* (2013.01); *H01L 28/91* (2013.01); *H10B 12/0335* (2023.02); *H10B 12/315* (2023.02)

(58) Field of Classification Search
CPC ......... H01L 28/75; H01L 28/91; H01L 28/90; H01L 28/40; H01L 28/56; H10B 12/0335; H10B 12/315; H10B 12/033
See application file for complete search history.

(56) References Cited

U.S. PATENT DOCUMENTS

| 9,159,729 | B2 | 10/2015 | Kim et al. |
| 10,014,212 | B2 | 7/2018 | Chen et al. |
| 10,378,105 | B2 | 8/2019 | Yu et al. |
| 2019/0333763 | A1 | 10/2019 | Tapily et al. |
| 2020/0354834 | A1 | 11/2020 | De Silva et al. |
| 2021/0125996 | A1* | 4/2021 | An .......................... H01L 28/90 |

FOREIGN PATENT DOCUMENTS

KR    2020-0128184 A    11/2020

\* cited by examiner

*Primary Examiner* — Thanhha S Pham
(74) *Attorney, Agent, or Firm* — HARNESS, DICKEY & PIERCE, P.L.C.

(57) ABSTRACT

A semiconductor device of the disclosure may include a substrate, a gate structure on the substrate, a capacitor contact structure connected to the substrate, a lower electrode connected to the capacitor contact structure, a supporter supporting a sidewall of the lower electrode, an interfacial layer covering the lower electrode and including a halogen material, a capacitor insulating layer covering the interfacial layer and the supporter, and an upper electrode covering the capacitor insulating layer. The interfacial layer may include a first surface contacting the lower electrode, and a second surface contacting the capacitor insulating layer. The halogen material of the interfacial layer may be closer to the first surface than to the second surface.

20 Claims, 18 Drawing Sheets

SEMICONDUCTOR DEVICE INCLUDING CAPACITOR STRUCTURE AND METHOD FOR MANUFACTURING THE SAME

CROSS-REFERENCE TO THE RELATED APPLICATION

This application claims priority from Korean Patent Application No. 10-2021-0161058, filed on Nov. 22, 2021 in the Korean Intellectual Property Office, the disclosure of which is incorporated herein by reference in its entirety.

BACKGROUND

1. Field

Example embodiments relate to a semiconductor device. In particular, example embodiments relate to a semiconductor device including a capacitor structure.

2. Description of the Related Art

Semiconductor devices are being highlighted in the electronics industry in accordance with characteristics thereof such as miniaturization, multi-functionalization, low manufacturing costs, etc. Semiconductor devices may be classified as a semiconductor memory device configured to store logic data, a semiconductor logic device configured to arithmetically process logic data, a hybrid semiconductor device including a memory element and a logic element, etc. In accordance with advances in the electronics industry, demand for characteristics of semiconductor devices is gradually increasing. For example, demand for high reliability, high speed, multi-functionalization, etc. of semiconductor devices is gradually increasing. In order to satisfy such demanded characteristics, structures in semiconductor devices have become more complicated. In addition, semiconductor devices have become more highly integrated

SUMMARY

Example embodiments provide a semiconductor device including a capacitor structure having enhanced dielectric characteristics.

A semiconductor device according to some example embodiments of the disclosure may include a substrate, a gate structure on the substrate, a capacitor contact structure connected to the substrate, a lower electrode connected to the capacitor contact structure, a supporter supporting a sidewall of the lower electrode, an interfacial layer covering the lower electrode and including a halogen material, a capacitor insulating layer covering the interfacial layer and the supporter, and an upper electrode covering the capacitor insulating layer. The interfacial layer may include a first surface contacting the lower electrode, and a second surface contacting the capacitor insulating layer. The halogen material of the interfacial layer may be closer to the first surface than to the second surface.

A semiconductor device according to some example embodiments of the disclosure may include a capacitor structure electrically connected to a substrate. The capacitor structure may include a lower electrode, a supporter supporting a sidewall of the lower electrode, an interfacial layer covering the lower electrode, a capacitor insulating layer covering the interfacial layer and the supporter, and an upper electrode covering the capacitor insulating layer. The interfacial layer may include first metal materials, first bonding materials bonded to the first metal materials, and halogen materials bonded to the first metal materials. The halogen materials of the interfacial layer may define a surface of the interfacial layer contacting the lower electrode. The halogen materials may be a halogen element.

A semiconductor device according to some example embodiments of the disclosure may include a capacitor structure electrically connected to a substrate. The capacitor structure may include a lower electrode, a supporter supporting a sidewall of the lower electrode, an interfacial layer covering the lower electrode, a capacitor insulating layer covering the interfacial layer and the supporter, and an upper electrode covering the capacitor insulating layer. The interfacial layer may include a first metal material, a first bonding material bonded to the first metal material, and a halogen material bonded to the first metal material. The lower electrode may include a second metal material, a second bonding material bonded to the second metal material, and a halogen substance bonded to the second metal material. The halogen material of the interfacial layer may be closer to the lower electrode than to the capacitor insulating layer. The halogen substance of the lower electrode may be closer to the interfacial layer than to a center of the lower electrode.

A method for manufacturing a semiconductor device in accordance with some example embodiments of the disclosure may include forming a lower electrode, forming a supporter supporting the lower electrode, surface-processing the lower electrode and the supporter, selectively forming an interfacial layer on the lower electrode, forming a capacitor insulating layer covering the interfacial layer and the supporter, and forming an upper electrode covering the capacitor insulating layer. The surface-processing the lower electrode and the supporter may include reacting a first source including a halogen compound with the lower electrode and the supporter.

DETAILED DESCRIPTION OF EXAMPLE EMBODIMENTS

Figure 1A:
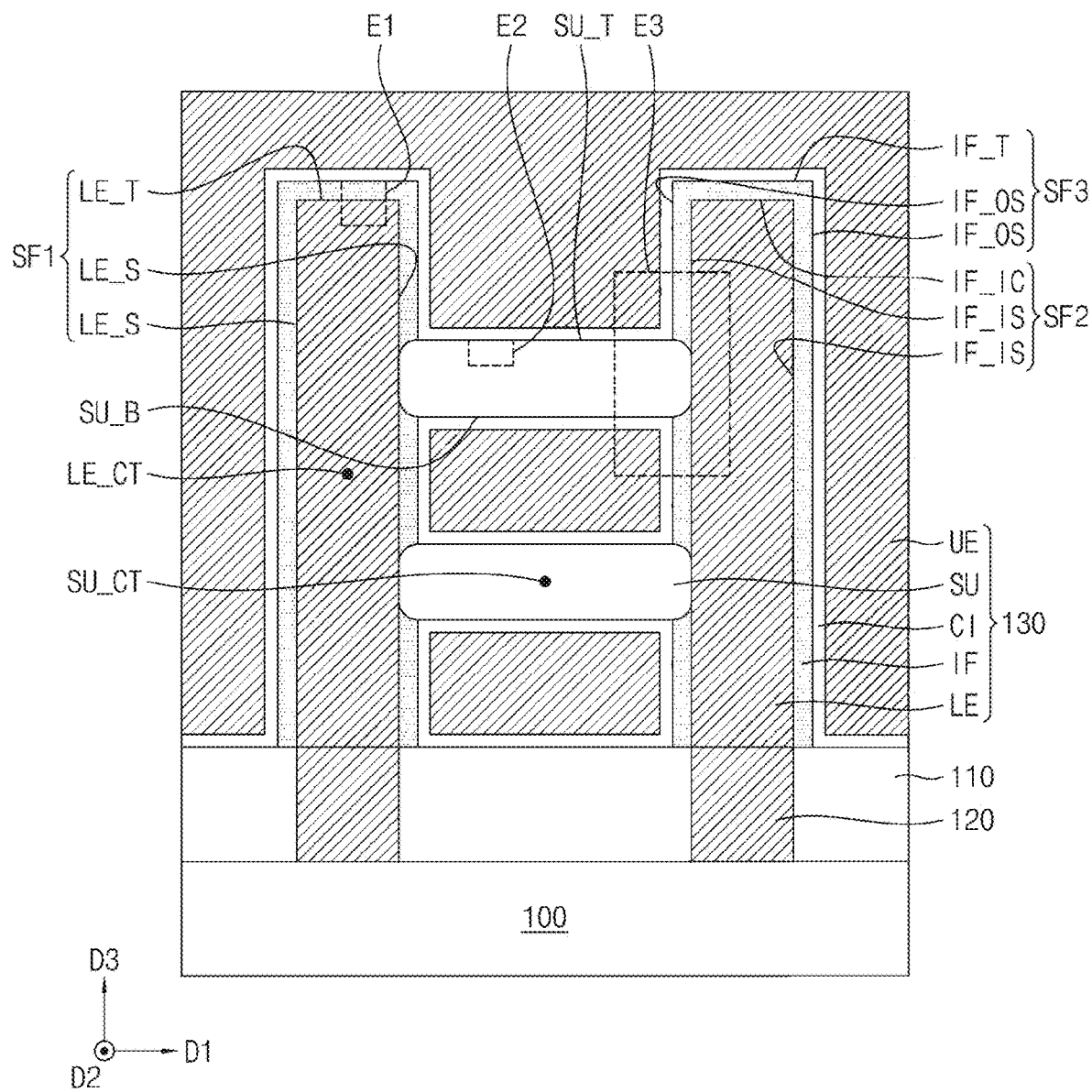
FIG. 1A is a cross-sectional view of a semiconductor device according to some example embodiments of the disclosure.
Figure 1B:
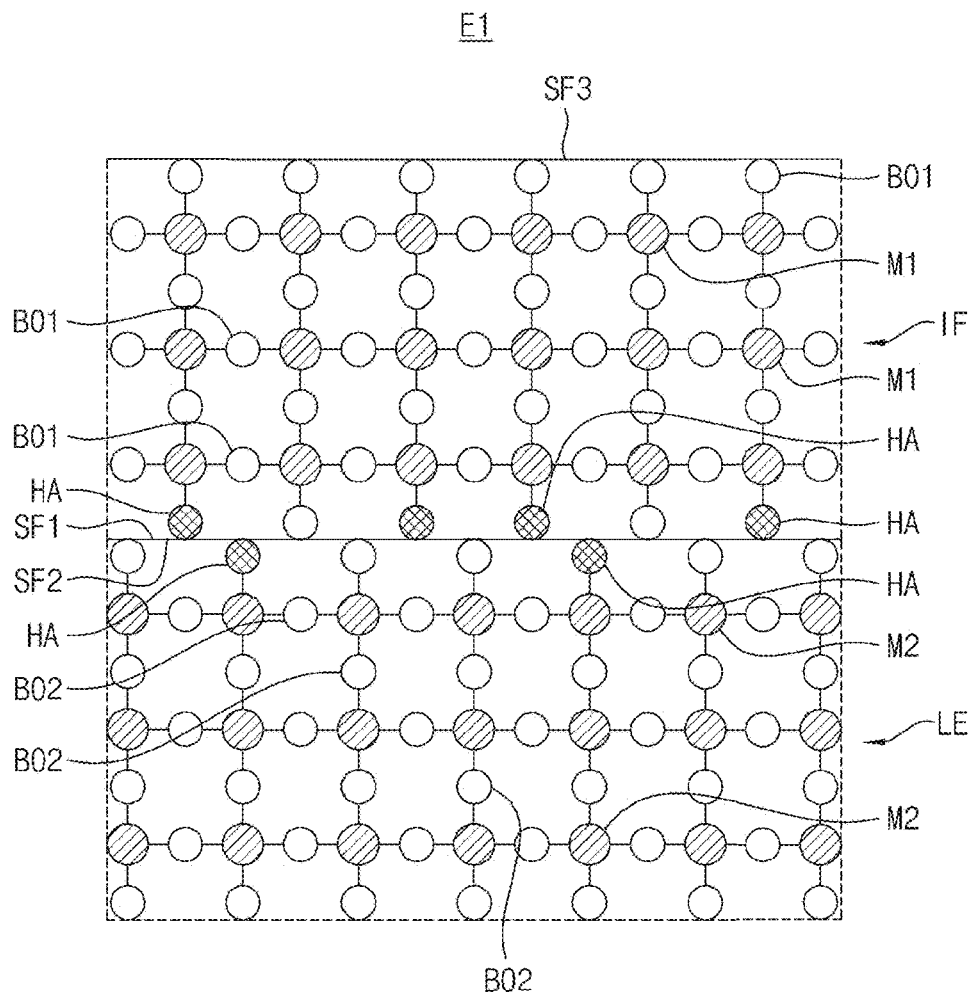
FIG. 1B is an enlarged view of a portion E1 of FIG. 1A.
Figure 1C:
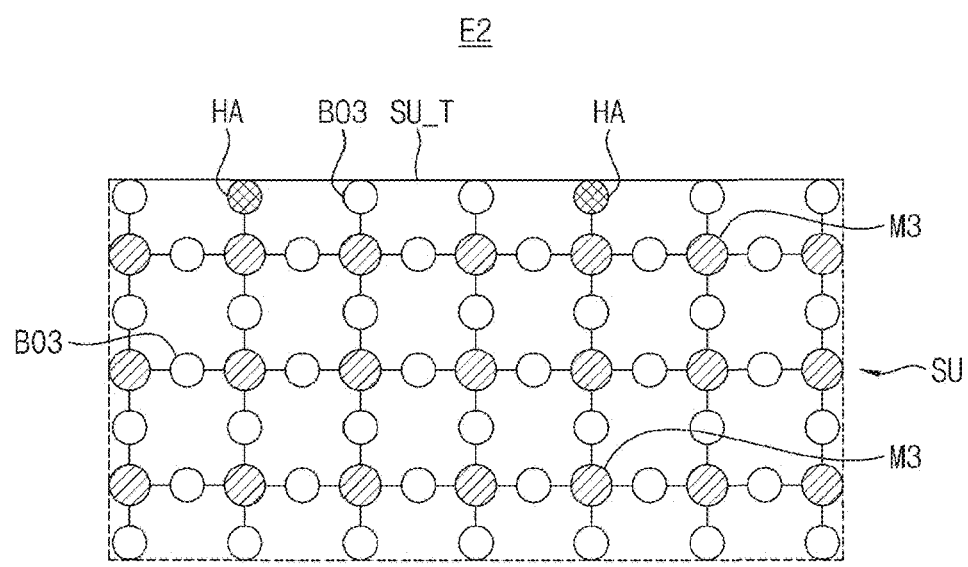
FIG. 1C is an enlarged view of a portion E2 of FIG. 1A.
Figure 1D:
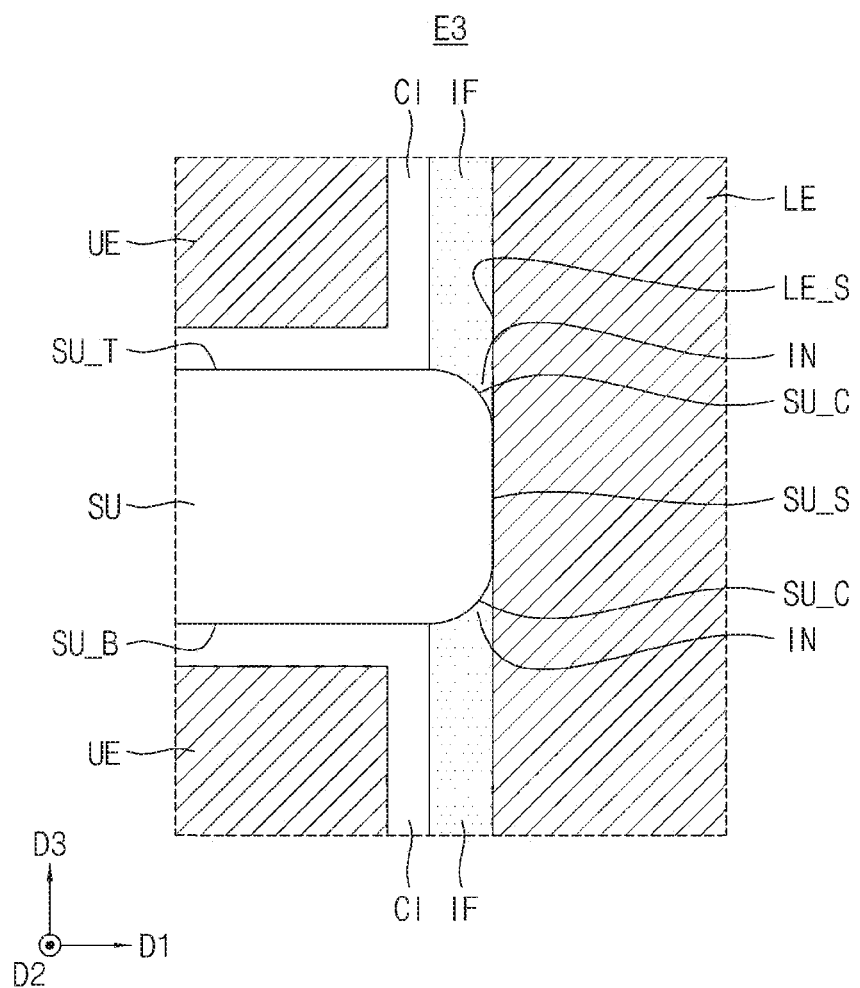
FIG. 1D is an enlarged view of a portion E3 of FIG. 1A.

FIG. 1A is a cross-sectional view of a semiconductor device according to some example embodiments of the disclosure. FIG. 1B is an enlarged view of a portion E1 of FIG. 1A. FIG. 1C is an enlarged view of a portion E2 of FIG. 1A. FIG. 1D is an enlarged view of a portion E3 of FIG. 1A.

Referring to FIG. 1A, the semiconductor device may include a substrate 100. In some embodiments, the substrate 100 may be a semiconductor substrate or a semiconductor-on-insulator substrate. For example, the substrate 100 may include silicon, germanium, silicon-germanium, GaP, or GaAs. In some embodiments, the substrate 100 may be a silicon-on-insulator (SOI) substrate or a germanium-on-insulator (GOI) substrate. The substrate 100 may have the form of a plate extending along a plane defined by a first direction D1 and a second direction D2. The first direction D1 and the second direction D2 may intersect each other. For example, the first direction D1 and the second direction D2 may be horizontal directions intersecting each other.

An interlayer insulating layer 110 covering the substrate 100 may be provided. In some embodiments, the interlayer insulating layer 110 may be a multilayer insulating layer including a plurality of insulating layers.

Capacitor contact structures 120 extending through the interlayer insulating layer 110 may be provided. The capacitor contact structures 120 may be connected to the substrate 100. In some embodiments, the capacitor contact structure 120 may be connected to an impurity region formed in the substrate 100. In some embodiments, each capacitor contact structure 120 may be a multilayer conductive layer including a plurality of conductive layers. The capacitor contact structures 120 may include, for example, tungsten.

A capacitor structure 130 may be provided on the interlayer insulating layer 110. The capacitor structure 130 may be electrically connected to the capacitor contact structures 120. The capacitor structure 130 may be electrically connected to the substrate 100 via the capacitor contact structures 120. The capacitor structure 130 may include lower electrodes LE, interfacial layers IF, a capacitor insulating layer CI, supporters SU, and an upper electrode UE.

The lower electrodes LE may have the form of a pillar extending in a third direction D3. The lower electrode LE may be connected to the capacitor contact structure 120. The supporters SU may support the lower electrodes LE. A sidewall of the supporter SU may contact a sidewall LE_S of the lower electrode LE and, as such, the supporter SU may support the sidewall LE_S of the lower electrode LE. A plurality of supporters SU may support one lower electrode LE. The plurality of supporters SU supporting one lower electrode LE may be disposed at different levels.

The interfacial layers IF may cover the lower electrodes LE. The interfacial layers IF may surround the lower electrodes LE, respectively. The interfacial layer IF may contact the side wall LE_S and a top surface LE_T of the lower electrode LE. The supporter SU may contact the side wall LE_S of the lower electrode LE while extending through the interfacial layer IF.

The capacitor insulating layer CI may cover the interfacial layers IF, the supporters SU, and the interlayer insulating layer 110. The capacitor insulating layer CI may surround the lower electrodes LE, the interfacial layers IF, and the supporters SU. The capacitor insulating layer CI may contact a top surface IF_T and an outer sidewall IF_OS of the interfacial layer IF. The capacitor insulating layer CI may contact a top surface SU_T and a bottom surface SU_B of the support SU. The capacitor insulating layer CI may contact a top surface of the interlayer insulating layer 110. The interfacial layer IF may be interposed between the lower electrode LE and the capacitor insulating layer CI. In some embodiments, the capacitor insulating layer CI may be a multilayer insulating layer. The capacitor insulating layer CI may include, for example, an oxide.

The upper electrode UE may cover the capacitor insulating layer CI. The upper electrode UE may surround the lower electrodes LE, the interfacial layers IF, and the supporters SU. Portions of the interfacial layer IF and the capacitor insulating layer CI may be interposed between the upper electrode UE and the lower electrode LE. The upper electrode UE may include, for example, TiN, TiNbN, or TiSiN.

The lower electrode LE may include a first surface SF1. The first surface SF1 may be a surface of the lower electrode LE contacting the interfacial layer IF. The first surface SF1 may include the top surface LE_T and the sidewall LE_S of the lower electrode LE.

The interfacial surface IF may include a second surface SF2. The second surface SF2 may be a surface of the interfacial surface IF contacting the lower electrode LE. The second surface SF2 may include an inner sidewall IF_IS and an inner connection surface IF_IC of the interfacial surface IF. The inner sidewall IF_IS of the interfacial layer IF may be a surface contacting the sidewall LE_S of the lower electrode LE. The inner connection surface IF_IC of the interfacial layer IF may be a surface contacting the top surface LE_T of the lower electrode LE. The inner connection surface IF_IC of the interfacial layer IF may be a surface connected to the inner sidewall IF_IS of the interfacial layer IF.

The interfacial layer IF may include a third surface SF3. The third surface SF3 may be a surface of the interfacial surface IF contacting the capacitor insulating layer CI. The third surface SF3 may include the top surface IF_T and the outer sidewall IF_OS of the interfacial layer IF.

Referring to FIG. 1B, the interfacial layer IF may include first metal materials M1, first bonding materials BO1, and halogen materials HA. The first bonding material BO1 and the halogen material HA may be bonded to the first metal material M1. In the interfacial layer IF, the number of the first bonding materials BO1 may be greater than the number of the halogen materials HA.

The first metal materials M1 may be identical metal elements. For example, the first metal materials M1 may be one of Nb, Ti, Zr, Hf, In, Al, Sr, Ba, Y, La, or Gd.

The halogen materials HA of the interfacial layer IF may be identical halogen elements. For example, the halogen materials HA of the interfacial layer IF may be one of F, Cl, I, or Br.

The first bonding materials BO1 may be nonmetal elements different from the halogen material HA. In some embodiments, the first bonding materials BO1 may be identical nonmetal elements. For example, the first bonding materials BO1 may be O. In some embodiments, the first bonding materials BO1 may be different nonmetal elements.

For example, a part of the first bonding materials BO1 may be O, and the remaining part of the first bonding material BO1 may be N.

The halogen materials HA of the interfacial layer IF may be disposed adjacent to the lower electrode LE. The halogen materials HA of the interfacial layer IF may be disposed nearer to the lower electrode LE than to the capacitor insulating layer CI. The halogen materials HA of the interfacial layer IF may be disposed adjacent to the second surface SF2 of the interfacial layer IF. The halogen materials HA of the interfacial layer IF may be disposed nearer to the second surface SF2 of the interfacial layer IF than to the third surface SF3 of the interfacial layer IF. The halogen materials HA of the interfacial layer IF may define the second surface SF2 of the interfacial layer IF. In other words, the halogen materials HA of the interfacial layer IF may be at least a part of materials constituting the second surface SF2 of the interfacial layer IF. The halogen materials HA of the interfacial layer IF may be exposed to the second surface SF2 of the interfacial layer IF. The interfacial layer IF may include halogen materials HA at the second surface SF2. The first bonding materials BO1 may be disposed in the entirety of the interfacial layer IF.

In example embodiments of the disclosure, bonding relation and disposition of the first metal materials M1, the first bonding materials BO1 and the halogen materials HA of the interfacial layer IF are not limited to those of the shown case. In some example embodiments of the disclosure, the numbers of first bonding materials BO1 and halogen materials HA bonded to the first metal material M1 are not limited to four.

The lower electrode LE may include second metal materials M2, second bonding materials BO2, and halogen materials HA. The second bonding material BO2 and the halogen material HA may be bonded to the second metal materials M2. In the lower electrode LE, the number of the second bonding materials BO2 may be greater than the number of the halogen materials HA. In example embodiments of the disclosure, materials included in the lower electrode LE are not limited to those of the shown case. In some embodiments, the lower electrode LE may not include halogen materials HA.

In some embodiments, the second metal materials M2 may be identical metal elements. For example, the second metal materials M2 may be Ti. In some embodiments, the second metal materials M2 may be different metal elements. For example, a part of the second metal materials M2 may be Ti, and the remaining part of the second metal materials M2 may be Si. In another example, a part of the second metal materials M2 may be Ti, and the remaining part of the second metal materials M2 may be Nb.

The halogen materials HA of the lower electrode LE may be identical halogen elements. The halogen materials HA of the lower electrode LE may be halogen elements identical to the halogen materials HA of the interfacial layer IF.

The second bonding materials BO2 may be nonmetal elements different from the halogen material HA. In some embodiments, the second bonding materials BO2 may be identical elements. For example, the second bonding materials BO2 may be N. In some embodiments, the second bonding materials BO2 may different elements. For example, a part of the second bonding materials BO2 may be N, and the remaining part of the second bonding materials BO2 may be O.

In some embodiments, the second bonding materials BO2 may be nonmetal elements different from the first bonding materials BO1. For example, the second bonding materials BO2 may be N, and the first bonding materials BO1 may be O.

The halogen materials HA of the lower electrode LE may be disposed adjacent to the interfacial layer IF. The halogen materials HA of the lower electrode LE may be disposed nearer to the interfacial layer IF than to a center LE_CT (see FIG. 1A) of the lower electrode LE. The halogen materials HA of the lower electrode LE may be disposed adjacent to the first surface SF1 of the lower electrode LE. The halogen materials HA of the lower electrode LE may be nearer to the first surface SF1 of the lower electrode LE than to the center LE_CT of the lower electrode LE. The halogen materials HA of the lower electrode LE may define the first surface SF1 of the lower electrode LE. In other words, the halogen materials HA of the lower electrode LE may be at least a part of materials constituting the first surface SF1 of the lower electrode LE. The halogen materials HA of the lower electrode LE may be exposed to the first surface SF1 of the lower electrode LE. The lower electrode LE may include halogen materials HA at the first surface SF1. The second bonding materials BO2 may be disposed in the entirety of the lower electrode LE.

In example embodiments of the disclosure, bonding relation and disposition of the second metal materials M2, the second bonding materials BO2 and the halogen materials HA of the lower electrode LE are not limited to those of the shown case. In example embodiments of the disclosure, the numbers of second bonding materials BO2 and halogen materials HA bonded to the second metal material M2 are not limited to four.

In some embodiments, a halogen material HA bonded to both the first metal material M1 and the second metal material M2 may be provided.

Referring to FIG. 1C, the supporter SU may include third metal materials M3, third bonding materials BO3, and halogen materials HA. The third bonding material BO3 and the halogen material HA may be bonded to the third metal material M3. In the supporter SU, the number of the third bonding materials BO3 may be greater than the number of the halogen materials HA. In example embodiments of the disclosure, materials included in the supporter SU are not limited to those of the shown case. In some embodiments, the supporter SU may not include halogen materials HA.

The third metal materials M3 may be identical metal elements. For example, the third metal materials M3 may be Si. The third metal materials M3 may have higher electron affinity than the first and second metal materials M1 and M2. For example, the third metal materials M3 may be Si, and the first and second metal materials M1 and M2 may be Ti having lower electron affinity than Si. In some embodiments, the interlayer insulating layer 110 (see FIG. 1A) may include the same metal material as the third metal material M3.

The halogen materials HA of the supporter SU may be identical halogen elements. The halogen materials HA of the supporter SU may be halogen elements identical to the halogen materials HA of the interfacial layer IF and the lower electrode LE.

The third bonding materials BO3 may be nonmetal elements different from the halogen material HA. In some embodiments, the third bonding materials BO3 may be identical elements. For example, the third bonding materials BO3 may be one of C, O or N. In some embodiments, the third bonding materials BO3 may be different elements. For example, a part of the third bonding materials BO3 may be N, and the remaining part of the third bonding materials BO3 may be C.

The halogen materials HA of the supporter SU may be disposed adjacent to the top surface SU_T of the supporter SU. The halogen materials HA of the supporter SU may be disposed nearer to the top surface SU_T than to a center SU_CT (see FIG. 1A) of the supporter SU. Similarly, the halogen materials HA of the supporter SU may be disposed adjacent to the bottom surface SU_B (see FIG. 1A) of the supporter SU.

Referring to FIG. 1D, the supporter SU may include connection surfaces SU_C. The connection surfaces SU_C may be a surface interconnecting the top surface SU_T and a side surface SU_S of the supporter SU or a surface interconnecting the bottom surface SU_B and the side surface SU_S of the supporter SU. The connection surfaces SU_C may be curved.

The connection surfaces SU_C may contact the interfacial surface IF. The interfacial surface IF may include interposition portions IN. Each of the interposition portions IN may be interposed between the connection surface SU_C and the sidewall LE_S of the lower electrode LE. The width in the first direction D1 of each of the interposition portions IN may be gradually reduced as the interposition portion IN extends toward the side wall SU_S of the supporter SU.

In some embodiments, an empty space may be provided between the connection surface SU_C and the lower electrode LE. The empty space may be adjacent to the side wall SU_S of the supporter SU. When the size of a material for forming the interfacial layer IF is relatively great, the empty space may be formed.

The semiconductor device according to example embodiments may include the interfacial layer IF selectively covering the lower electrode LE and, as such, dielectric characteristics of the capacitor structure CT may be enhanced. As the interfacial layers IF respectively covering the lower electrodes LE are not interconnected, the lower electrodes LE may be completely electrically isolated from one another. Accordingly, a leakage phenomenon of the capacitor structure 130 may be limited and/or prevented.

Figure 2:
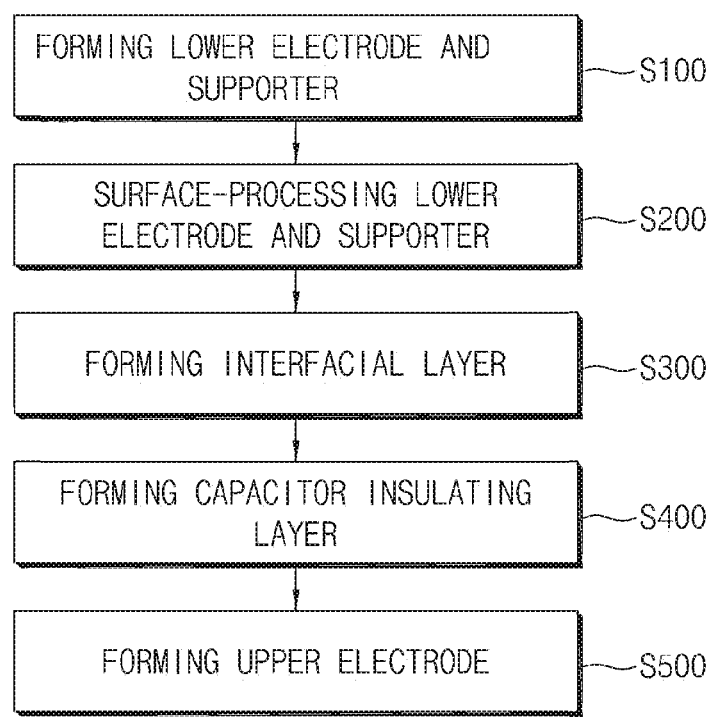
FIG. 2 is a flowchart explaining a method for manufacturing a capacitor structure in accordance with some example embodiments of the disclosure.
Figure 4A:
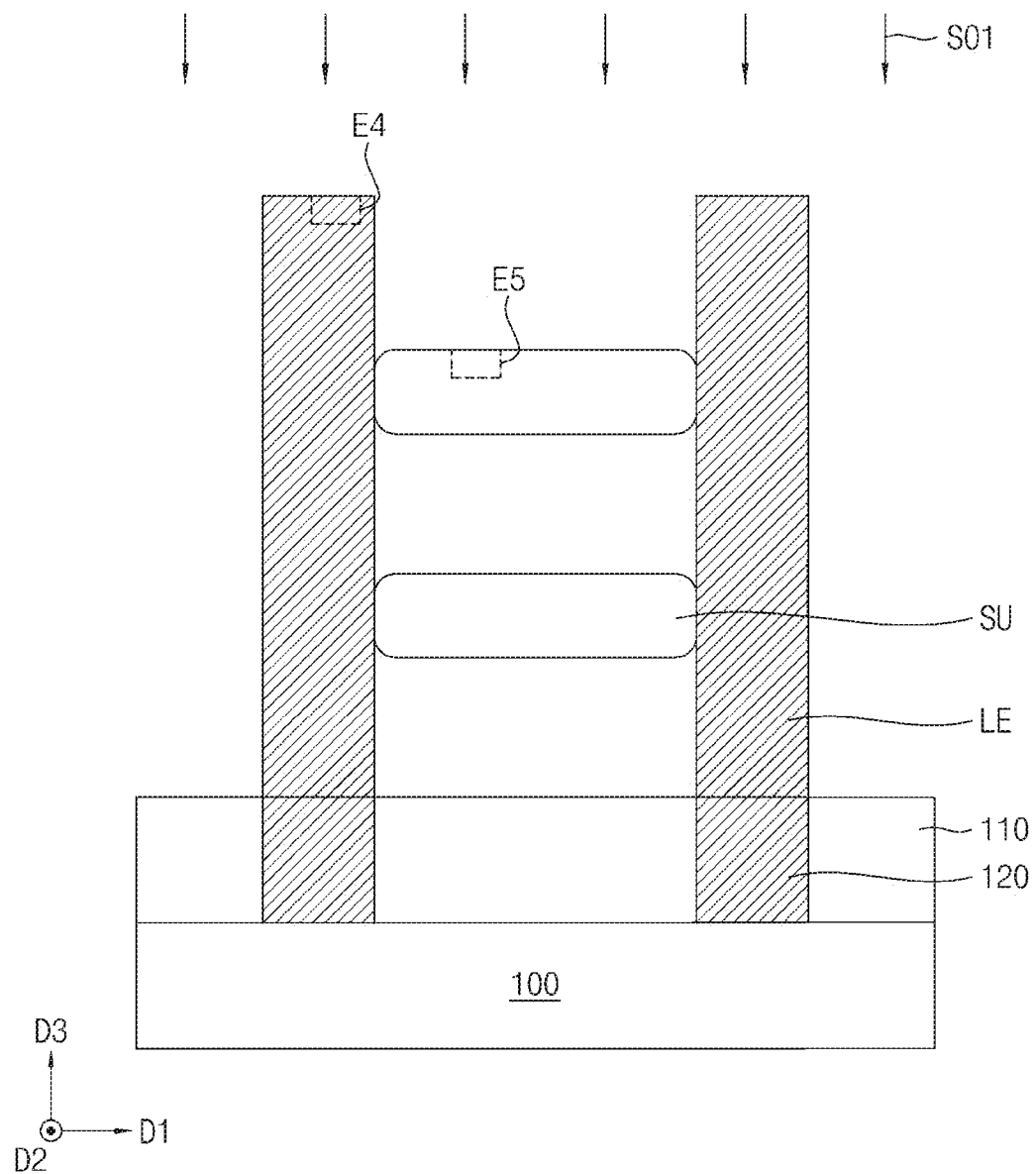
Figure 4B:
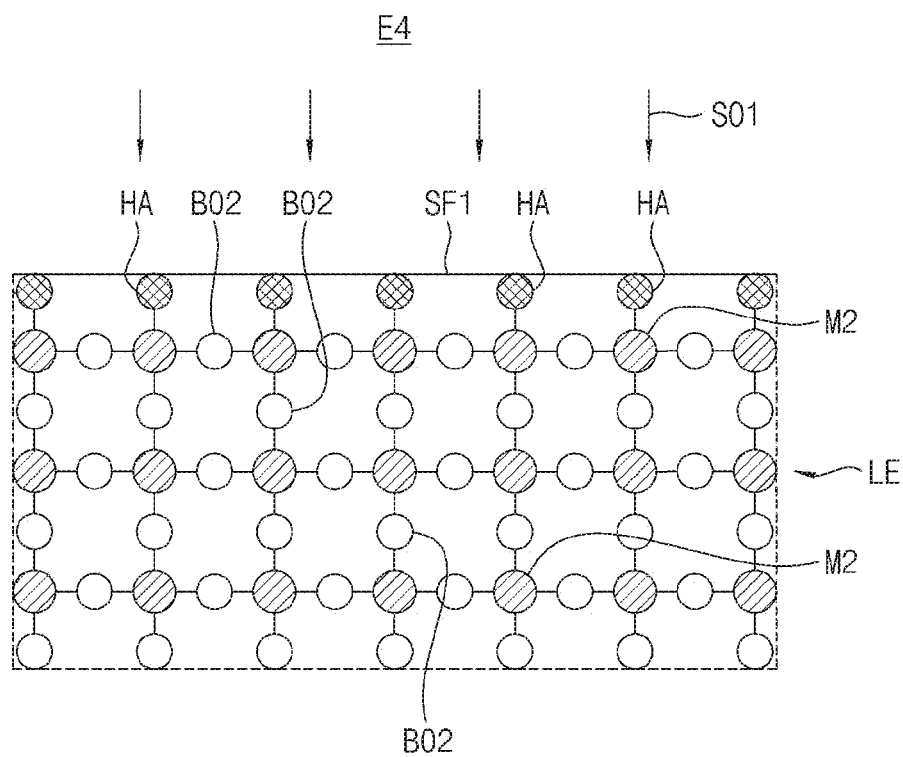
FIG. 4B is an enlarged view of a portion E4 of FIG. 4A.
Figure 4C:
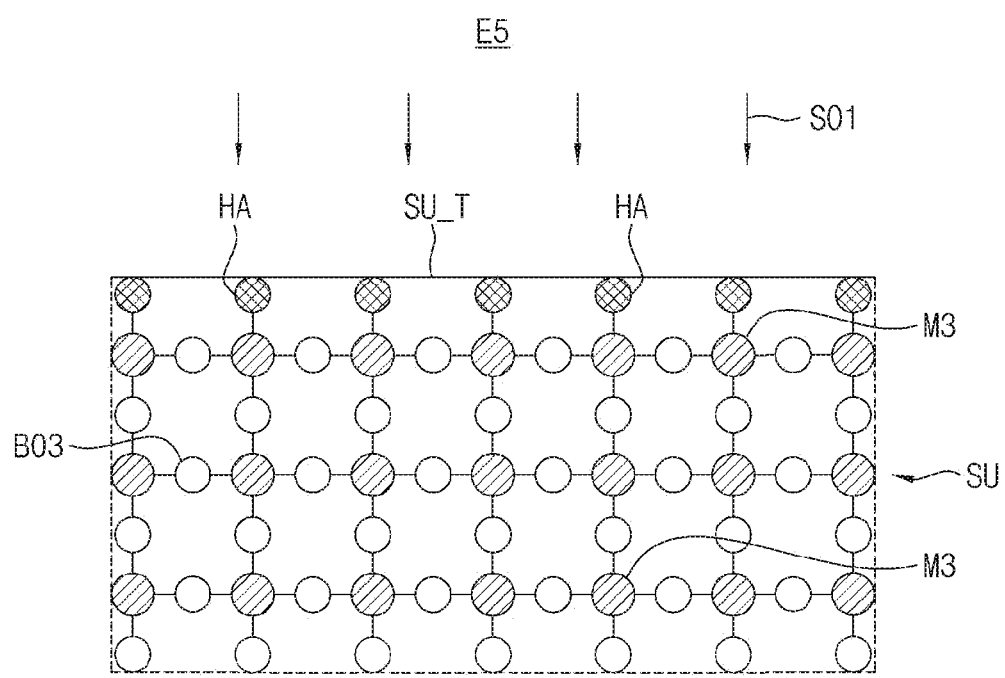
FIG. 4C is an enlarged view of a portion E5 of FIG. 4A.
Figure 5A:
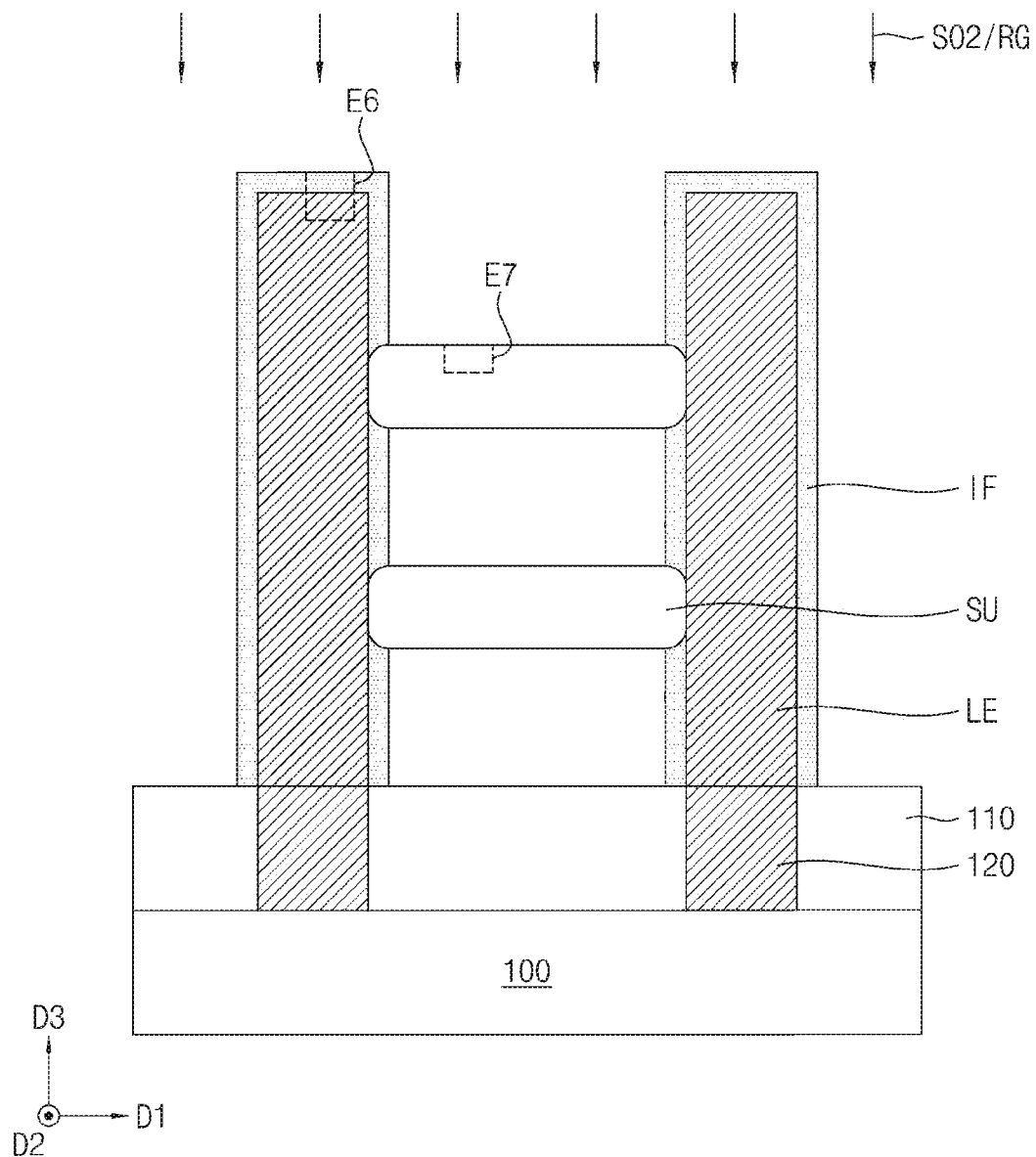
Figure 5B:
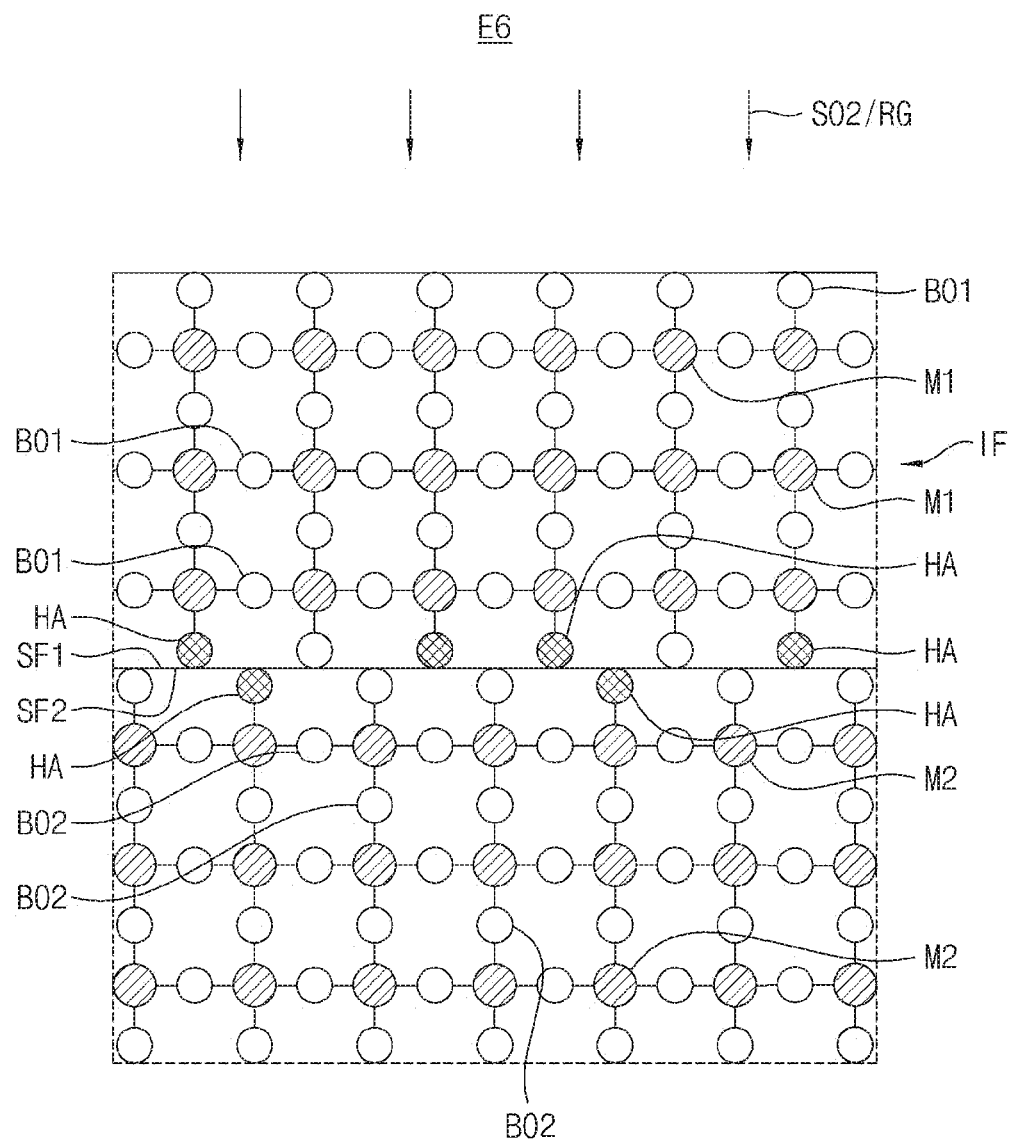
FIG. 5B is an enlarged view of a portion E6 of FIG. 5A.
Figure 5C:
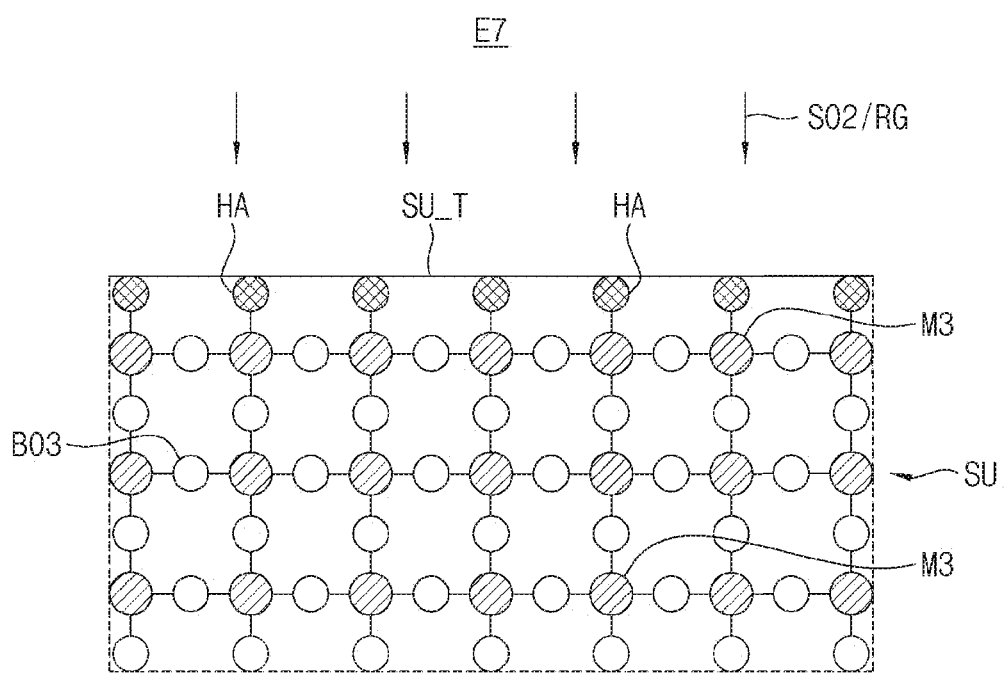
FIG. 5C is an enlarged view of a portion E7 of FIG. 5A.

FIG. 2 is a flowchart explaining a method for manufacturing a capacitor structure in accordance with some example embodiments of the disclosure. FIGS. 3, 4A, 5A, and 6 are cross-sectional views explaining a method for manufacturing a capacitor structure in accordance with some example embodiments of the disclosure. FIG. 4B is an enlarged view of a portion E4 of FIG. 4A. FIG. 4C is an enlarged view of a portion E5 of FIG. 4A. FIG. 5B is an enlarged view of a portion E6 of FIG. 5A. FIG. 5C is an enlarged view of a portion E7 of FIG. 5A.

Figure 3:
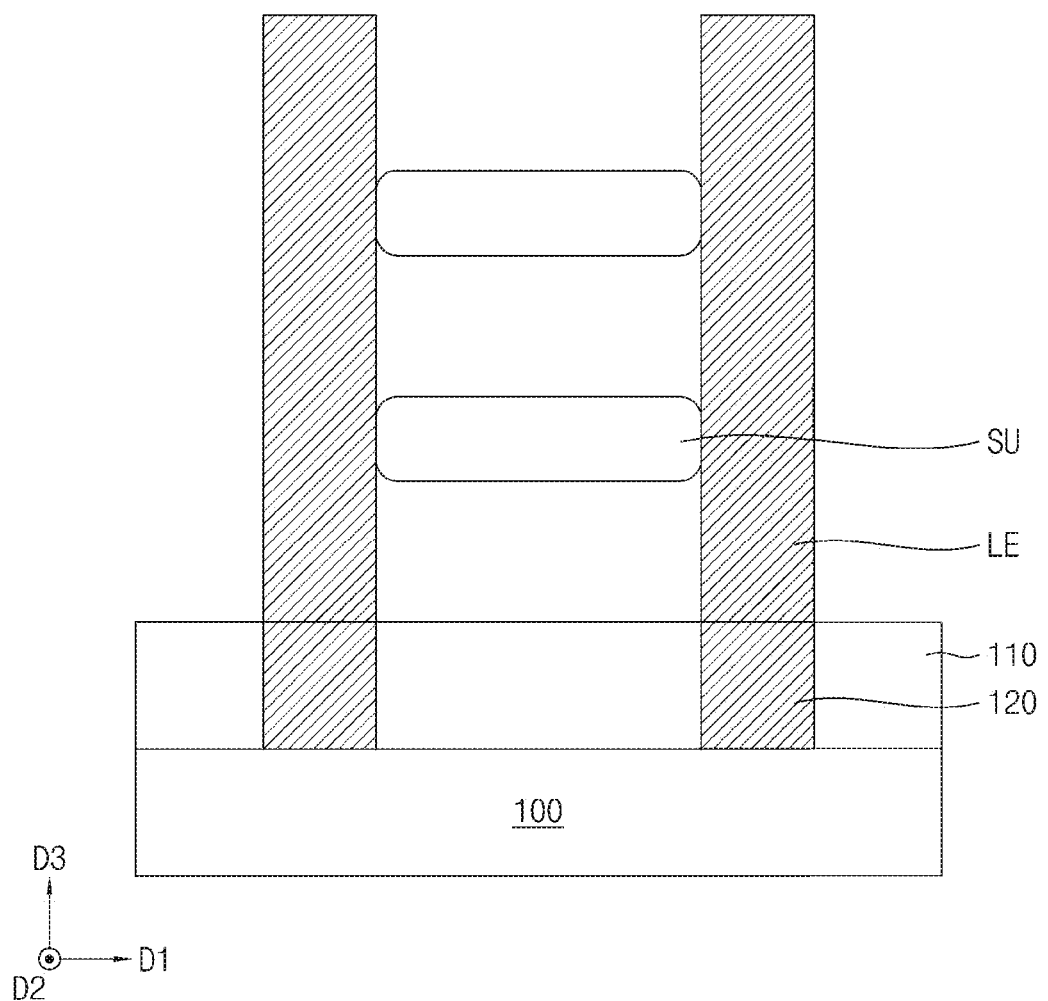
FIGS. 3, 4A, 5A, and 6 are cross-sectional views explaining a method for manufacturing a capacitor structure in accordance with some example embodiments of the disclosure.

Referring to FIGS. 2 and 3, a semiconductor device manufacturing method according to some example embodiments of the disclosure may include forming a substrate 100, an interlayer insulating layer 110, a capacitor contact structure 120, and a capacitor structure 130.

The interlayer insulating layer 110 may be formed on the substrate 100, and the capacitor contact structure 120, which extends through the interlayer insulating layer 110, may be formed on the substrate 100. The capacitor structure 130 may be formed on the capacitor contact structure 120.

Forming the capacitor structure 130 may include forming a lower electrode and a supporter (S100), surface-processing the lower electrode and the supporter (S200), forming an interfacial layer (S300), forming a capacitor insulating layer (S400), and forming an upper electrode (S500).

Lower electrodes LE, which are connected to capacitor contact structures 120, may be formed, and supporters SU supporting the lower electrodes LE may be formed (S100). The lower electrodes LE may include second metal materials M2 (see FIG. 1B), and second bonding materials BO2 (see FIG. 1B) bonded to the second metal materials M2. The supporters SU may include third metal materials M3 (see FIG. 1C) and third bonding materials BO3 (see FIG. 1C) bonded to the third metal materials M3.

Referring to FIGS. 2, 4A, 4B, and 4C, the lower electrodes LE and the supporters SU may be surface-processed (S200). The lower electrodes LE and the supporters SU may be surface-processed through supply of a first source 501. The first source SO1 may react with the lower electrodes LE and the supporters SU.

The first source SO1 may include a halogen compound. For example, the first source SO1 may be a gas or plasma including $BF_3$, $AlF_3$, $GaF_3$, $InF_3$, $PF_3$, $PF_5$, $AsF_3$, $SbF_3$, $SbF_5$, $SiF_4$, $GeF_4$, $TiF_4$, $TaF_5$, $WF_6$, $WOF_4$, $HfF_4$, $CdF_2$, $SeF_6$, $SeF_4$, $TeF_4$, $TeF_6$, $NF_3$, $CF_4$, $CHF_3$, $CH_3F$, $C_2F_6$, $C_4F_8$, $SF_6$, or a combination thereof, or may be a liquid including $NH_4F$, HF, or a combination thereof. In another example, the first source SO1 may include a chlorine compound, an iodine compound, or a bromine compound.

As the first source SO1 reacts with the lower electrodes LE and the supporters SU, a halogen element included in the first source SO1 may be bonded to the second metal material M2 of the lower electrode LE or the third metal material M3 of the supporter SU. As the halogen element is bonded to the second metal material M2 of the lower electrode LE, a halogen material HA of the lower electrode LE may be formed. As the halogen element is bonded to the third metal material M3 of the supporter SU, a halogen material HA of the supporter SU may be formed.

Halogen materials HA of the lower electrode LE may be adjacent to a first surface SF1 of the lower electrode LE. Halogen materials HA of the supporter SU may be adjacent to a top surface SU_T and a bottom surface SU_B (see FIG. 1A) of the supporter SU.

In some embodiments, the halogen element may be bonded to a metal material of the interlayer insulating layer 110, thereby forming a halogen material in the interlayer insulating layer 110.

Referring to FIGS. 2, 5A, 5B, and 5C, an interfacial layer IF may be formed (S300). Forming the interfacial layer IF (S300) may include performing an atomic layer deposition (ALD) process for repeatedly executing an ALD cycle. The ALD cycle may include supplying a second source SO2, purging the second source SO2, supplying a reactive gas RG, and purging the reactive gas RG.

The second source SO2 may include a metal compound including a metal element and ligands binding to the metal element. The metal element of the second source SO2 may be, for example, one of Nb, Ti, Zr, Hf, In, Al, Sr, Ba, Y, La, or Gd. The ligands of the second source SO2 may be, for example, an amine compound or a cyclopentadienyl($C_5H_5$).

As the second source SO2 is supplied, the supplied second source SO2 may selectively react with the lower electrodes LE. As the second metal materials M2 included in the lower electrode LE have lower electron affinity than the third metal materials M3 included in the supporter SU, the metal element included in the second source SO2 may be selectively bonded to the halogen material HA of the lower electrode LE, but may not be bonded to the halogen material HA of the supporter SU. As the metal element of the second source SO2 is bonded to the halogen material HA of the lower electrode LE, a first metal material M1 may be formed.

In some embodiments, a part of the halogen materials HA of the lower electrode LE may be bonded to the metal element of the second source SO2, and the remaining part of the halogen materials HA of the lower electrode LE may not be bonded to the metal element of the second source SO2. In some embodiments, all of the halogen materials HA of the lower electrode LE may be bonded to the metal element of the second source SO2.

The second source SO2 may be purged, and the reactive gas RG may be supplied. The reactive gas RG may include a nonmetal element bondable to the first metal material M1. For example, the reactive gas RG may be $O_2$, $O_3$ or $H_2O$ gas. In accordance with supply of the reactive gas RG, the nonmetal element of the reactive gas GR may be bonded to the first metal material M1, and ligands may be detached from the first metal material M1. As the nonmetal element of the reactive gas RG is bonded to the first metal material M1, a first bonding material BO1 may be formed.

The reactive gas RG may be purged, and the ALD cycle may be repeated, thereby again supplying the second source SO2. The supplied second source SO2 may selectively react with first bonding materials BO1. As first metal materials M1 have lower electron affinity than the third metal materials M3 included in the supporter SU, the metal element included in the second source SO2 may be selectively bonded to the first bonding material BO1, but may not be bonded to the halogen material HA of the supporter SU. As the metal element of the second source SO2 is bonded to the first bonding materials BO1, a first metal material M1 may be formed.

As the ALD cycle of the ALD process is repeated, as described above, the interfacial layer IF, which includes first metal materials M1, first bonding materials BO1 and a halogen material HA, may be selectively formed on the lower electrode LE, but may not be formed on the supporter SU. In some embodiments, no interfacial layer IF may be formed on the interlayer insulating layer 110, similarly to the supporter SU.

Figure 6:
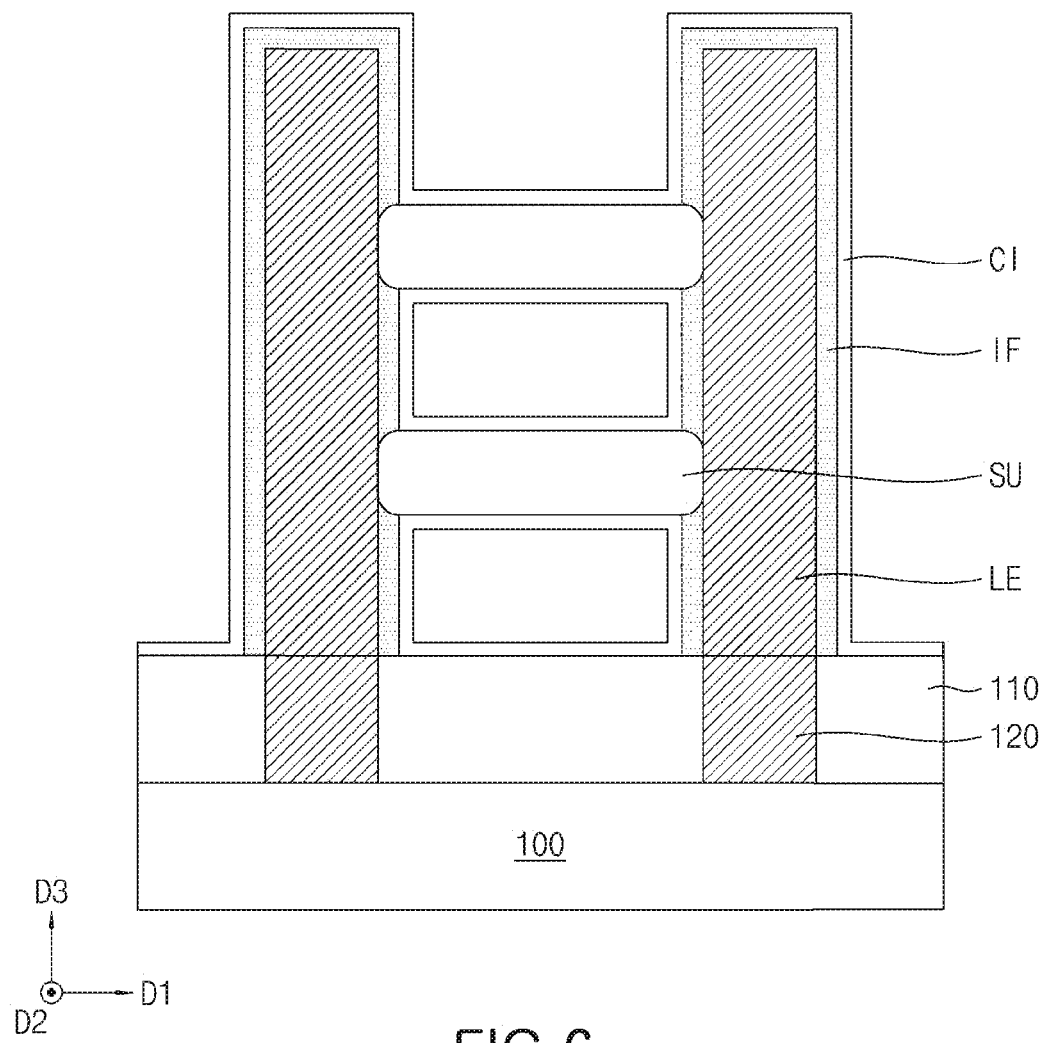

Referring to FIGS. 2 and 6, a capacitor insulating layer CI may be formed (S400). The capacitor insulating layer CI may be formed on interfacial layers IF and supporters SU. In some embodiments, a part of the halogen materials HA included in the supporters SU may be removed in a process of forming the capacitor insulating layer CI. In some embodiments, all of the halogen materials HA included in the supporters SU may be removed in the process of forming the capacitor insulating layer CI.

Referring to FIGS. 2 and 1A, an upper electrode UE may be formed on the capacitor insulating layer CI (S500).

The method for manufacturing the capacitor structure 130 in accordance with example embodiments may include surface-processing the lower electrode LE and the supporter SU and, as such, may selectively form the interfacial layer IF on the lower electrode LE. Accordingly, interfacial layers IF respectively covering lower electrodes LE may be separated from one another without execution of a process of etching the interfacial layers IF and, as such, time and costs may be reduced.

Figure 7:
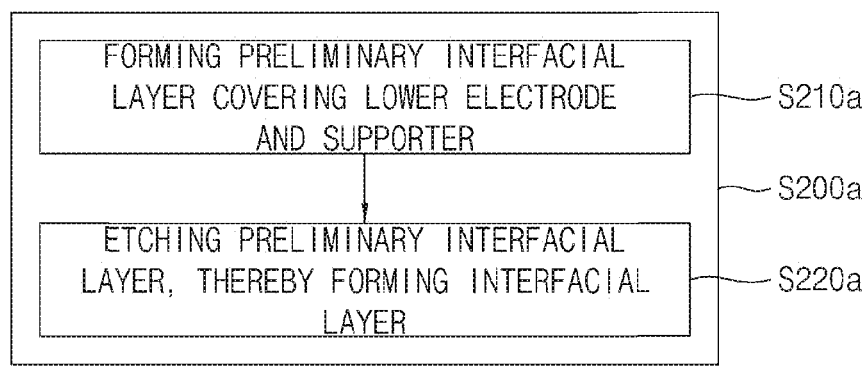
FIG. 7 is a flowchart explaining an interfacial layer formation method according to some example embodiments of the disclosure.
Figure 8:
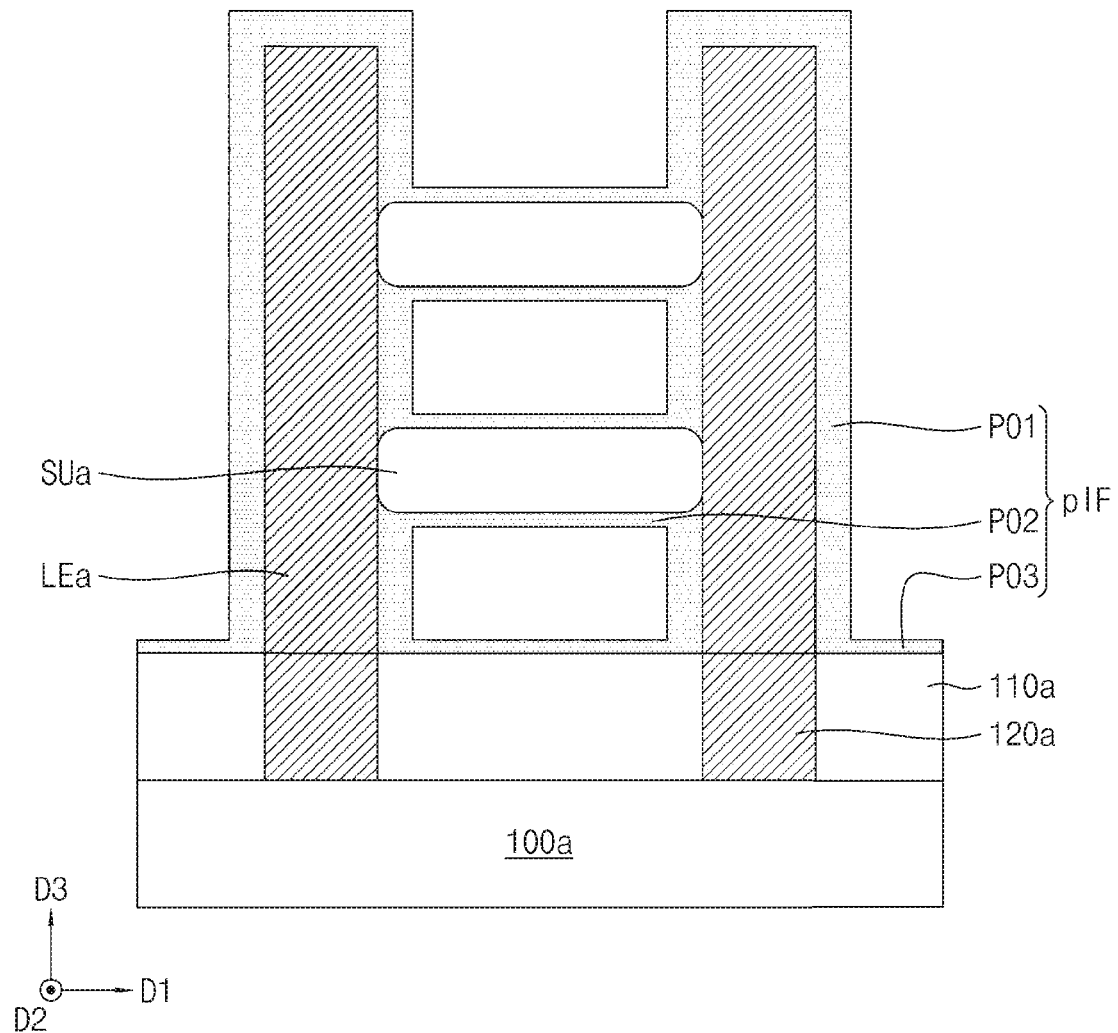
FIG. 8 is a cross-sectional view explaining the interfacial layer formation method according to the example embodiments of the disclosure.

FIG. 7 is a flowchart explaining an interfacial layer formation method according to some example embodiments of the disclosure. FIG. 8 is a cross-sectional view explaining the interfacial layer formation method according to example embodiments of the disclosure.

Referring to FIGS. 7 and 8, in the interfacial layer formation method according to example embodiments of the disclosure, forming an interfacial layer (S200a) may include forming a preliminary interfacial layer covering a lower electrode and a supporter (S210a), and etching the preliminary interfacial layer, thereby forming the interfacial layer (S220a).

Similar to the case described with reference to FIG. 3, a substrate 100a, an interlayer insulating layer 110a, a capacitor contact structure 120a, lower electrodes LEa, and supporters SUa may be formed. Thereafter, the lower electrodes Lea and the supporters SUa may be surface-processed, similarly to the case described with reference to FIGS. 4A, 4B, and 4C.

Subsequently, a preliminary interfacial layer pIF covering the lower electrodes LEa and the supporters SUa may be formed (S210a). The preliminary interfacial layer pIF may cover the lower electrodes LEa, the supporters SUa, and the interlayer insulating layer 110a.

The preliminary interfacial layer pIF may include a first portion PO1 covering the lower electrode LEa, a second portion PO2 covering the supporter SUa, and a third portion PO3 covering the interlayer insulating layer 110a. The thickness of the first portion PO1 may be greater than the thickness of the second portion PO2 and the thickness of the third portion PO3.

When the number of repetition times of an ALD cycle in an ALD process for formation of the preliminary interfacial layer pIF is relatively great, the preliminary interfacial layer pIF may be formed to have a relatively small thickness on the supporter SUa and the interlayer insulating layer 110a.

The preliminary interfacial layer pIF may be etched, thereby forming an interfacial layer (S220a). In accordance with etching of the preliminary interfacial layer pIF, the second and third portions PO2 and PO3 of the preliminary interfacial layer pIF may be removed and, as such, the preliminary interfacial layer pIF may be divided, thereby forming interfacial layers.

Figure 9A:
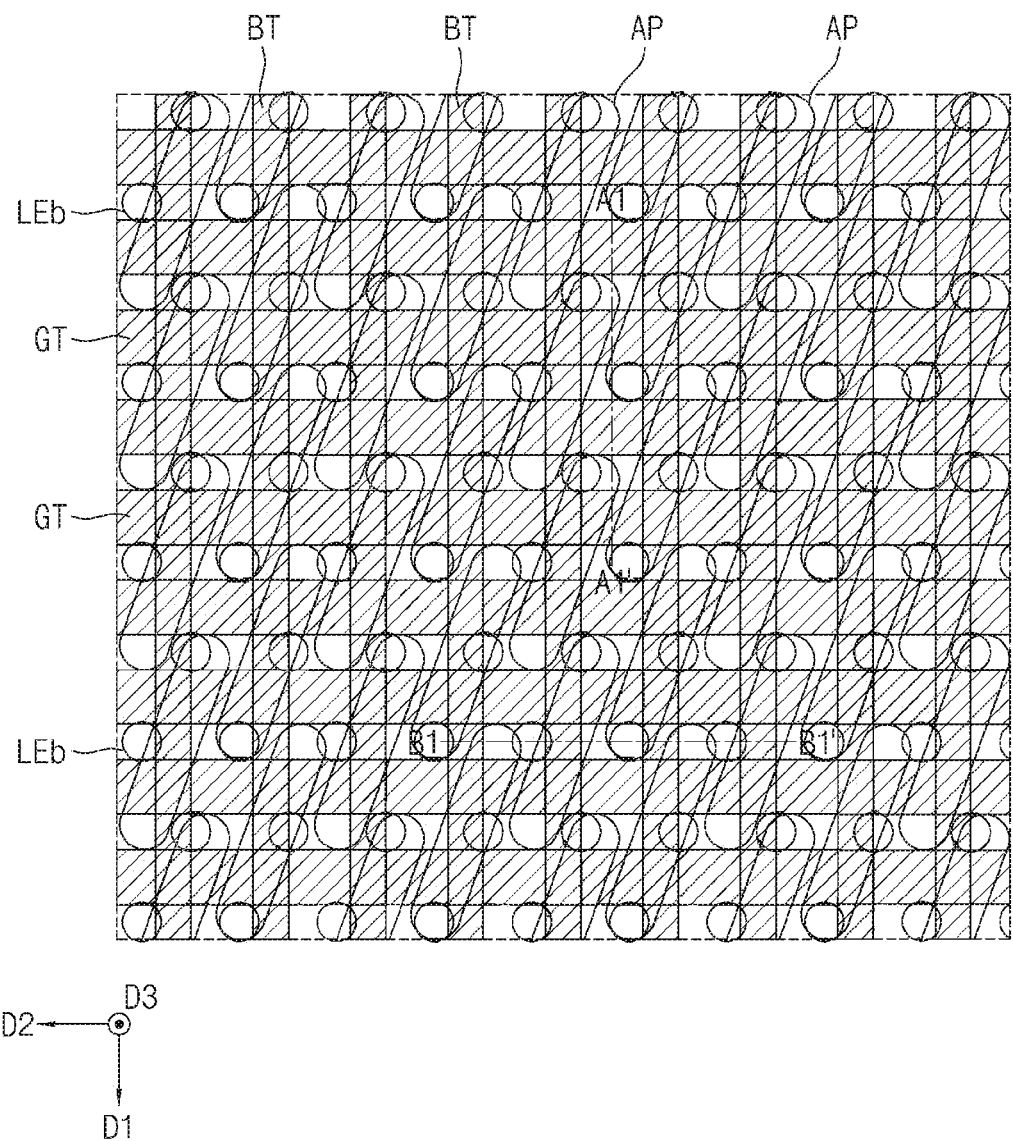
FIG. 9A is a plan view of a semiconductor device according to example embodiments of the disclosure.
Figure 9B:
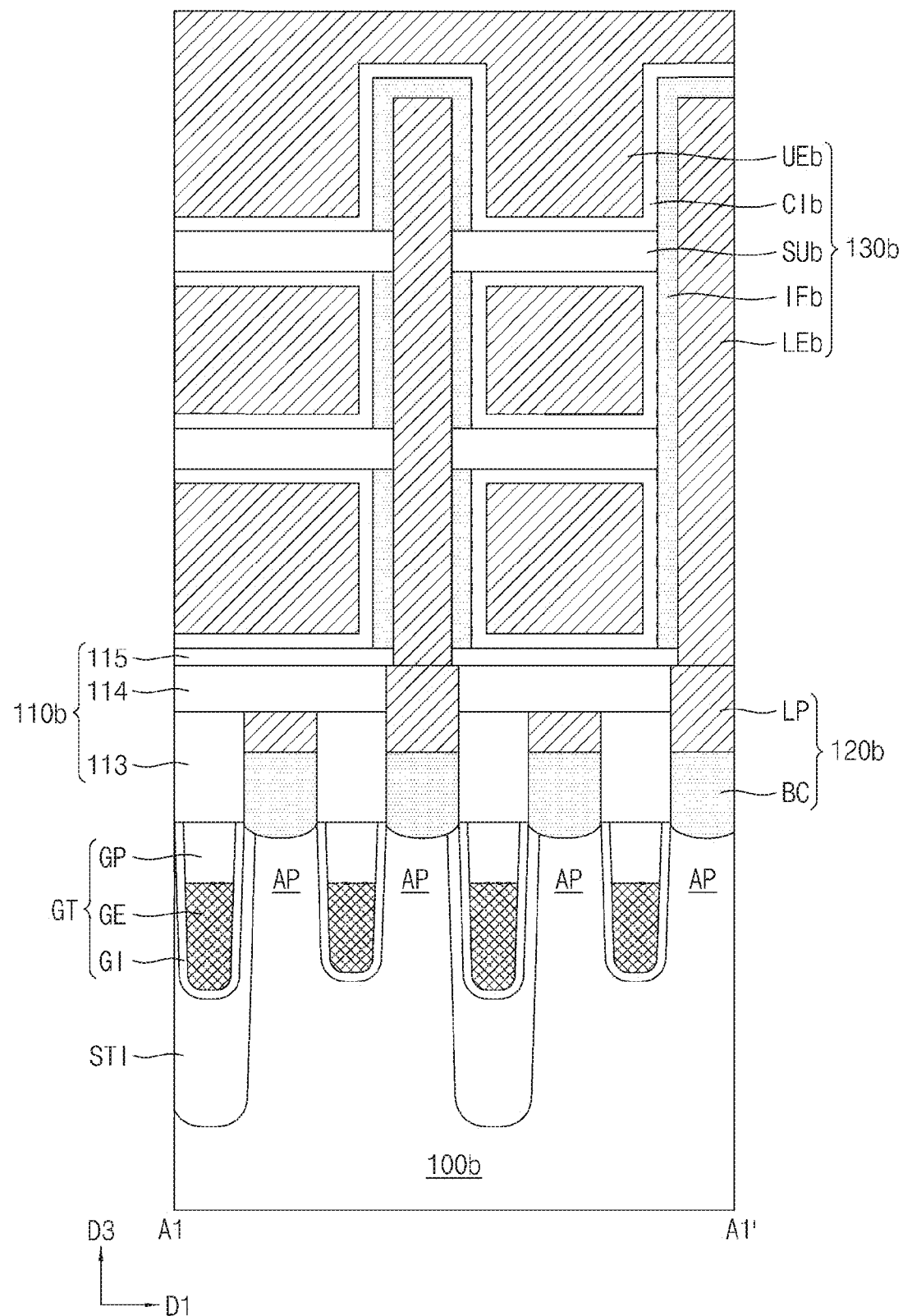
FIG. 9B is a cross-sectional view taken along line A1-A1' in FIG. 9A.
Figure 9C:
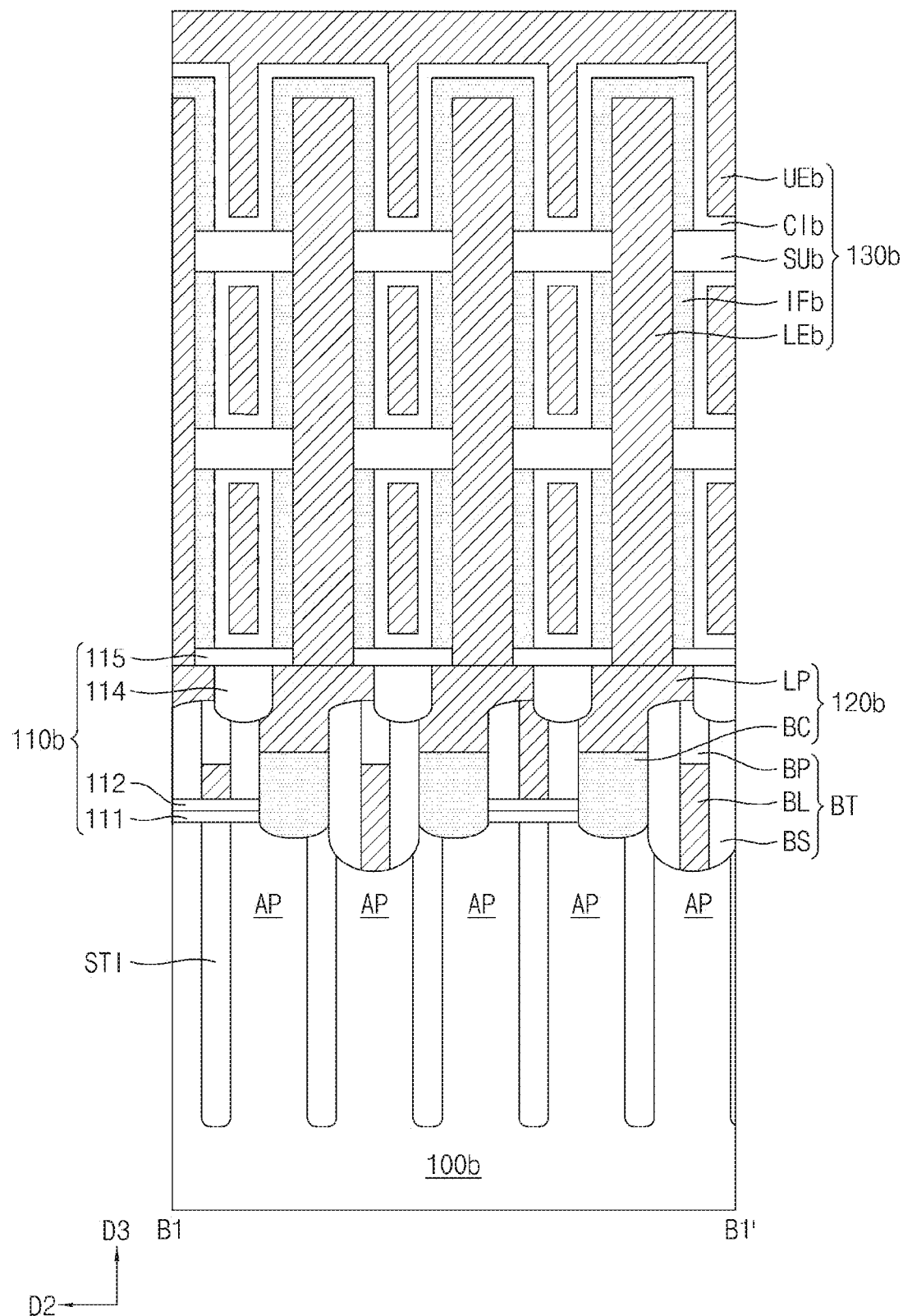
FIG. 9C is a cross-sectional view taken along line B1-B1' in FIG. 9A.

FIG. 9A is a plan view of a semiconductor device according to example embodiments of the disclosure. FIG. 9B is a cross-sectional view taken along line A1-A1' in FIG. 9A. FIG. 9C is a cross-sectional view taken along line B1-B1' in FIG. 9A.

Referring to FIGS. 9A, 9B, and 9C, the semiconductor device may include a substrate 100b.

The substrate 100b may include active patterns AP. Upper portions of the substrate 100b protruding in a third direction D3 may be defined as the active patterns AP. The active patterns AP may be spaced apart from one another.

An element isolation layer STI may be provided in a space provided among the active patterns AP. The active patterns AP may be defined by the element isolation layer STI. Each of the active patterns AP may be surrounded by the element isolation layer STI. The element isolation layer STI may include an insulating material. For example, the element isolation layer STI may include an oxide.

Gate structures GT extending in a second direction D2 may be provided. The gate structures GT may be spaced apart from one another in a first direction D1. The gate structure GT may be provided on the element isolation layer STI and the active patterns AP. The gate structure GT may be a buried gate structure buried in the active patterns AP and the element isolation layer STI. The active patterns AP may include impurity regions. A cell transistor including the gate structure GT and the impurity regions of the active pattern AP may be defined.

Each of the gate structures GT may include a gate insulating layer GI, a gate electrode GE, and a gate capping layer GP. The gate insulating layer GI may cover surfaces of the active patterns AP and the element isolation layer STI. The gate electrode GE and the gate capping layer GP may be provided inside the gate insulating layer GI. The gate electrode GE may be spaced apart from the active pattern AP by the gate insulating layer GI. The gate capping layer GP may cover a top surface of the gate electrode GE. The gate insulating layer GI and the gate capping layer GP may include an insulating material. The gate electrode GE may include a conductive material.

Bit line structures BT extending in the first direction D1 may be provided. The bit line structures BT may be spaced apart from one another in the second direction D2. The bit line structure BT may be electrically connected to the active pattern AP.

Each of the bit line structures BT may include a bit line BL, a bit line capping layer BP, and bit line spacers BS. The bit line BL may be connected to the active pattern AP. The bit line BL may include a conductive material. The bit line capping layer BP may be provided on the bit line BL. The bit line capping layer BP may include an insulating material. The bit line spacers BS may be provided at opposite sides of the bit line BL and the bit line capping layer BP. The bit line spacers BS may include an insulating material.

An interlayer insulating layer 110b covering the substrate 100b, the gate structures GT and the bit line structures BT may be provided. The interlayer insulating layer 110b may include first and second insulating patterns 111 and 112, insulating fences 113, a separation pattern 114, and an etch stop layer 115.

Capacitor contact structures 120b, which are connected to the active patterns AP of the substrate 100b, may be provided. Each of the capacitor contact structures 120b may include a buried contact BC and a landing pad LP.

First and second insulating patterns 111 and 112 may be provided on the substrate 100b. The second insulating pattern 112 may be provided on the first insulating pattern 111. The first and second insulating patterns 111 and 112 may include different insulating materials, respectively.

The insulating fences 113 may be provided on the gate capping layer GP of the gate structure GT. The insulating fence 113 may be provided between adjacent ones of the bit line structures BT. The insulating fence 120 may include an insulating material.

The buried contact BC may be connected to the active pattern AP. The buried contact BC may be provided between adjacent ones of the insulating fences 113. The buried contact BC may include a conductive material.

The landing pad LP may be provided on the buried contact BC. The landing pad LP may be provided between adjacent ones of the insulating fences 113. The landing pad LP may be electrically connected to the active pattern AP via the buried contact BC. The landing pad LP may include a conductive material. In some embodiments, the landing pad LP may include a diffusion barrier layer. In some embodiments, a metal silicide layer may be provided between the landing pad LP and the buried contact BC.

The separation pattern 114 may be provided on the bit line structures BT and the insulating fences 113. The separation pattern 114 may space the landing pads LP apart from one another. The separation pattern 114 may include an insulating material.

The etch stop layer 115 may be provided on the separation pattern 114. The etch stop layer 115 may include an insulating material.

A capacitor structure 130b may be provided on the etch stop layer 115. The capacitor structure 130b may include lower electrodes LEb, a capacitor insulating layer CIb, supporters SUb, interfacial layers IFb, and an upper electrode UEb. The capacitor structure 130b may be connected to the landing pad LP. The capacitor structure 130b may be electrically connected to the active pattern AP via the landing pad LP and the buried contact BC.

The lower electrode LEb may be connected to the landing pad LP. The interfacial layers IFb may selectively cover the lower electrodes LEb, and may expose the supporters SUb and the etch stop layer 115. The capacitor insulating layer CIb may cover the etch stop layer 115, the interfacial layers IFb, and the supporters SUb.

Figure 10A:
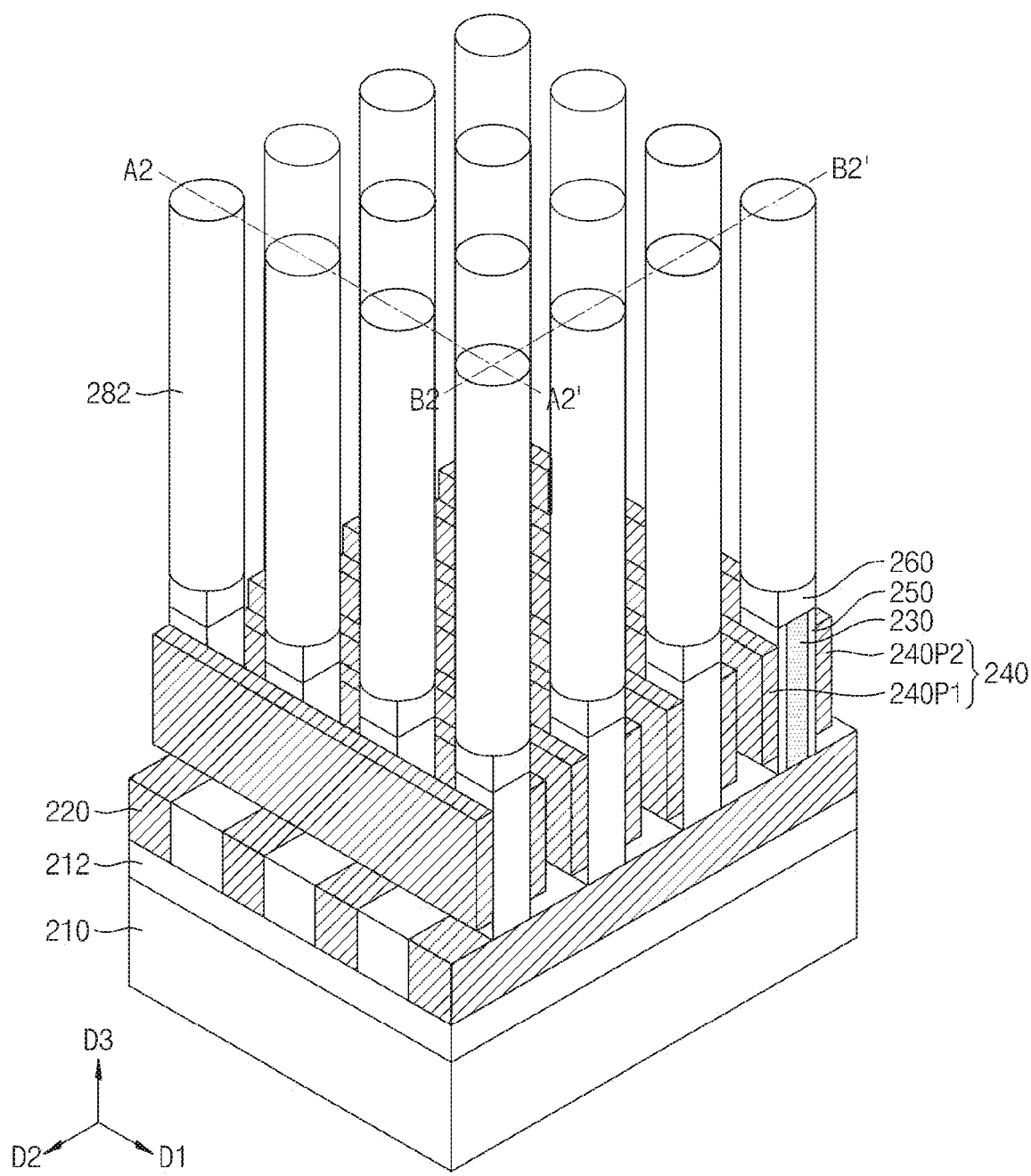
FIG. 10A is a perspective view of a semiconductor device according to some example embodiments of the disclosure.
Figure 10B:
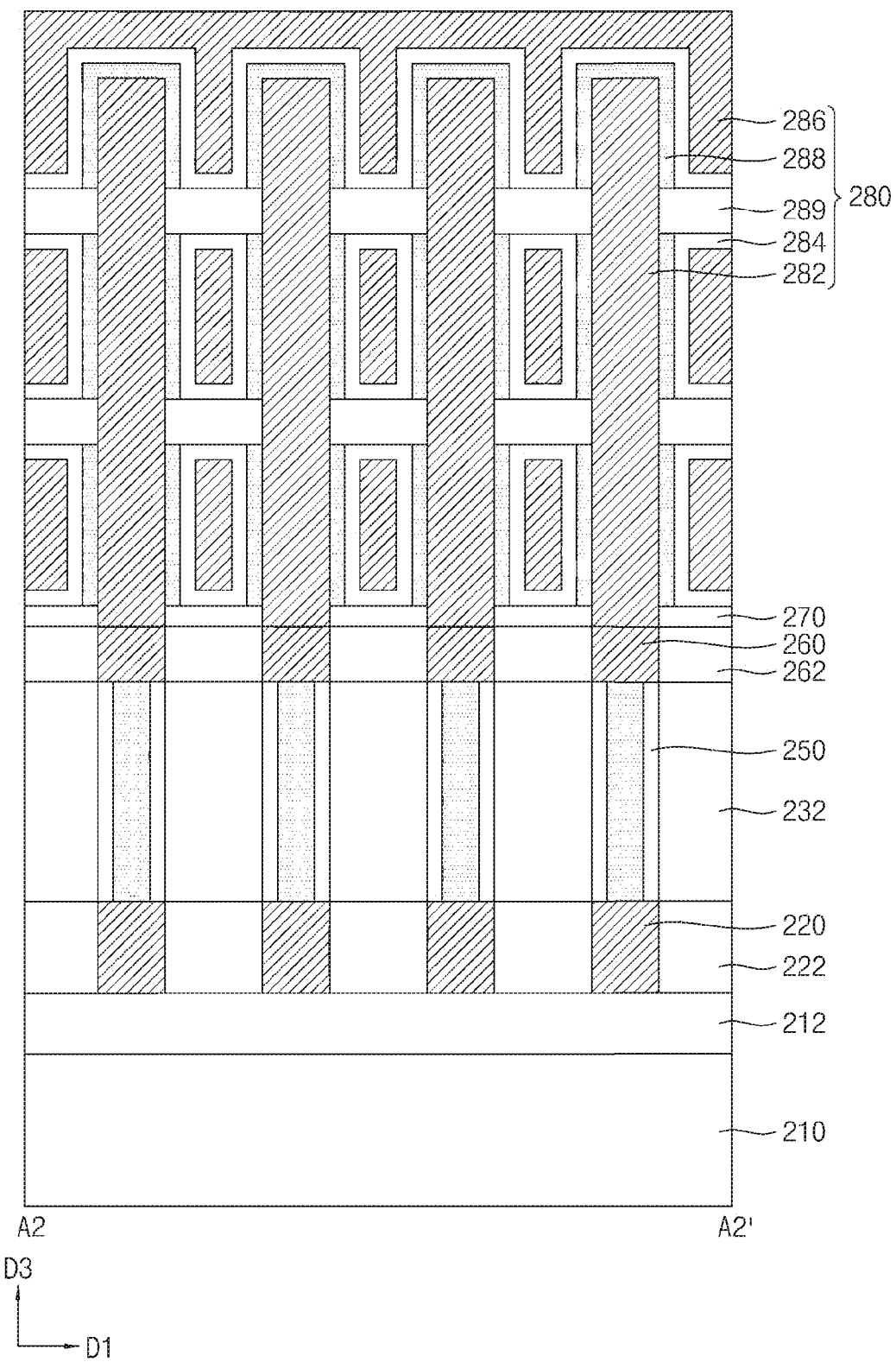
FIG. 10B is a cross-sectional view taken along line A2-A2' of FIG. 10A.
Figure 10C:
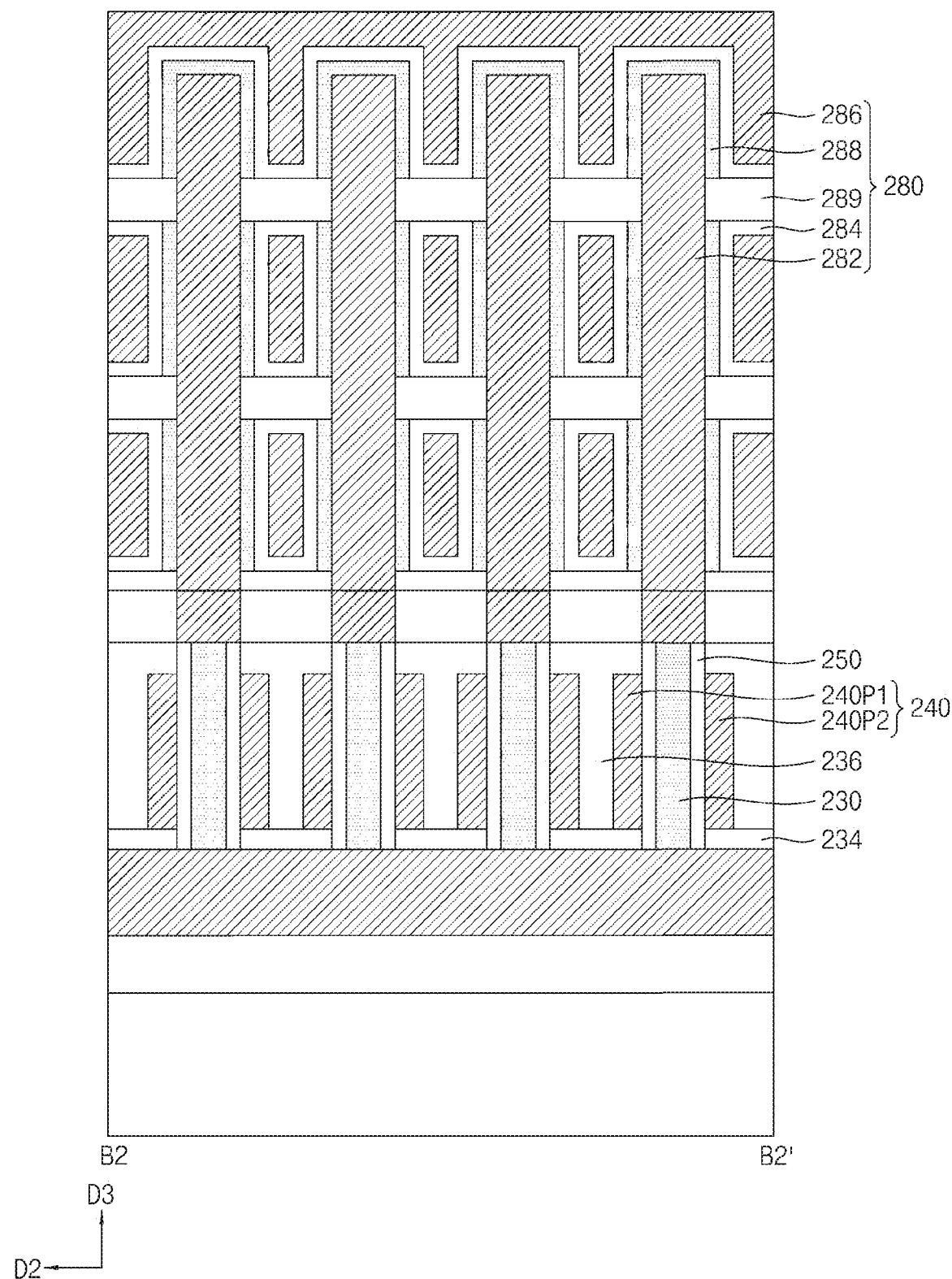
FIG. 10C is a cross-sectional view taken along line B2-B2' of FIG. 10A.

FIG. 10A is a perspective view of a semiconductor device according to some example embodiments of the disclosure. FIG. 10B is a cross-sectional view taken along line A2-A2' of FIG. 10A. FIG. 10C is a cross-sectional view taken along line B2-B2' of FIG. 10A.

Referring to FIGS. 10A, 10B, and 10C, a semiconductor device 200 may include a substrate 210, a plurality of first conductive lines 220, a channel layer 230, a gate electrode 240, a gate insulating layer 250, and a capacitor structure 280. The semiconductor device 200 may be a memory device including a vertical channel transistor (VCT). The vertical channel transistor may represent a structure in which a channel length of the channel layer 230 extends from the substrate 210 in a vertical direction.

A lower insulating layer 212 may be disposed on the substrate 210, and the plurality of first conductive lines 220 may be disposed on the lower insulating layer 212 under a condition that the plurality of first conductive lines 220 is spaced apart from one another in a first direction D1 while extending in a second direction D2. A plurality of first insulating structures 222 may be disposed on the lower insulating layer 212, to fill a space among the plurality of first conductive lines 220. The plurality of first insulating structures 222 may extend in the second direction D2, and a top surface of the plurality of first insulating structures 222 may be disposed at the same level as a top surface of the plurality of first conductive lines 220. The plurality of first conductive lines 220 may function as a bit line of the semiconductor device 200.

In some embodiments, the plurality of first conductive lines 220 may include doped polysilicon, a metal, a conductive metal nitride, a conductive metal silicide, a conductive metal oxide, or a combination thereof. For example, the plurality of first conductive lines 220 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, without being limited thereto. The plurality of first conductive lines 220 may include a single layer or multiple layers of the above-described materials. In some embodiments, the plurality of first conductive lines 220 may include a two-dimensional semiconductor material and, for example, the two-dimensional semiconductor material may include graphene, a carbon nanotube, or a combination thereof.

Channel layers 230 may be arranged on the plurality of first conductive lines 220 in the form of a matrix in which the channel layers 230 are spaced apart from one another in the first direction D1 and the second direction D2. The channel layer 230 may have a first width in the first direction D1 and a first height in a third direction D3, and the first height may be greater than the first width. For example, the first height may be about 2 to 10 times the first width, without being limited thereto. A bottom portion of the channel layer 230 may function as a first source/drain region (not shown), an upper portion of the channel layer 230 may function as a second source/drain region (not shown), and a portion of the channel layer 230 between the first and second source/drain regions may function as a channel region (not shown).

In some embodiments, the channel layer 230 may include an oxide semiconductor and, for example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 230 may include a single layer or multiple layers of the oxide semiconductor. In some embodiments, the channel layer 230 may have greater bandgap energy than silicon. For example, the channel layer 230 may have bandgap energy of about 1.5 to 5.6 eV. For example, the channel layer 230 may have optimum channel performance when the channel layer 230 has bandgap energy of about 2.0 to 4.0 eV. For example, the channel layer 230 may be polycrystalline or amorphous, without being limited thereto. In some embodiments, the channel layer 230 may include a two-dimensional semiconductor material and, for example, the two-dimensional semiconductor material may include graphene, a carbon nanotube, or a combination thereof.

The gate electrode 240 may extend in the first direction D1 on opposite sidewalls of the channel layer 230. The gate electrode 240 may include a first sub-gate electrode 240P1 facing a first sidewall of the channel layer 230, and a second sub-gate electrode 240P2 facing a second sidewall of the channel layer 230 opposing the first sidewall. As one channel layer 230 is disposed between the first sub-gate electrode 240P1 and the second sub-gate electrode 240P2, the semiconductor device 200 may have a dual gate transistor structure. However, example embodiments are not limited to the above-described case, and a single gate transistor structure may be embodied by omitting the second sub-gate electrode 240P2, and forming only the first sub-gate electrode 240P1 facing the first sidewall of the channel layer 230.

The gate electrode 240 may include doped polysilicon, a metal, a conductive metal nitride, a conductive metal silicide, a conductive metal oxide, or a combination thereof. The gate electrode 240 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, without being limited thereto.

The gate insulating layer 250 may surround a sidewall of the channel layer 230, and may be interposed between the channel layer 230 and the gate electrode 240. For example, the entire sidewall of the channel layer 230 may be surrounded by the gate insulating layer 250, and a portion of a sidewall of the gate electrode 240 may contact the gate insulating layer 250. In some embodiments, the gate insulating layer 250 may extend in an extension direction of the gate electrode 240, and only two sidewalls facing the gate electrode 240 from among sidewalls of the channel layer 230 may contact the gate insulating layer 250.

In some embodiments, the gate insulating layer 250 may be constituted by a silicon oxide layer, a silicon oxynitride layer, a high-k dielectric layer having a higher dielectric constant than the silicon oxide layer, or a combination thereof. The high-k dielectric layer may be constituted by a metal oxide or a metal oxynitride. For example, the high-k dielectric layer, which is usable as the gate insulating layer 250, may be constituted by $HfO_2$, HfSiO, HfSiON, HfTaO, HfTiO, HfZrO, $ZrO_2$, $Al_2O_3$, or a combination thereof, without being limited thereto.

A plurality of second insulating structures 232 may extend on the plurality of first insulating structures 222 in the second direction D2, and the channel layer 230 may be disposed between two adjacent second insulating structures 232 from among the plurality of second insulating structures 232. In addition, between the two adjacent second insulating structures 232, a first buried layer 234 and a second buried layer 236 may be disposed in a space between two adjacent channel layers 230. The first buried layer 234 may be disposed at a bottom portion of the space between the two adjacent channel layers 230, and the second buried layer 236 may be formed on the first buried layer 234, to fill a remaining portion of the space between the two adjacent channel layers 230. A top surface of the second buried layer 236 may be disposed at the same level as a top surface of the channel layer 230, and the second buried layer 236 may cover a top surface of the gate electrode 240. Otherwise, the plurality of second insulating structures 232 may be formed by a material layer in continuity with the plurality of first insulating structures 222, or the second buried layer 236 may be formed by a material layer in continuity with the first buried layer 234.

A capacitor contact structure 260 may be disposed on the channel layer 230. The capacitor contact structure 260 may be disposed to vertically overlap with the channel layer 230. Capacitor contact structures 260 may be arranged in the form of a matrix in which the capacitor contact structures 260 are spaced apart from one another in the first direction D1 and the second direction D2. The capacitor contact structure 260 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, without being limited thereto. The upper insulating layer 262 may surround a sidewall of the capacitor contact structure 260 on the plurality of second insulating structures 232 and the second buried layer 236.

An etch stop layer 270 may be disposed on the upper insulating layer 262, and a capacitor structure 280 may be disposed on the etch stop layer 270. The capacitor structure 280 may include lower electrodes 282, a capacitor insulating layer 284, an upper electrode 286, interfacial layers 288, and supporters 289.

The lower electrode 282 may be electrically connected to a top surface of the contact structure 260 while extending through the etch stop layer 270. In some embodiments, the lower electrode 282 may be disposed to vertically overlap with the capacitor contact structure 260. The lower electrodes 282 may be arranged in the form of a matrix in which the lower electrodes 282 are spaced apart from one another in the first direction D1 and the second direction D2.

The interfacial layers 288 may be disposed between the lower electrodes 282 and the capacitor insulating layer 284. The supporters 289 may support the lower electrodes 282. The interfacial layers 288 may be selectively provided on the lower electrodes 282, and may not be provided on the supporters 289.

The semiconductor device according to example embodiments may include an interfacial layer selectively covering a lower electrode. According, lower electrodes may be completely electrically isolated from one another and, as such, a leakage phenomenon of a capacitor structure may be limited and/or prevented.

While some example embodiments of the disclosure have been described with reference to the accompanying drawings, it should be understood by those skilled in the art that various modifications may be made without departing from the spirit and scope of example embodiments of the disclosure. Therefore, the above-described embodiments should be considered in a descriptive sense only and not for purposes of limitation.

What is claimed is:

1. A semiconductor device comprising:
a substrate;
a gate structure on the substrate;
a capacitor contact structure connected to the substrate;
a lower electrode connected to the capacitor contact structure;
a supporter supporting a sidewall of the lower electrode;
an interfacial layer covering the lower electrode and including a halogen material, the interfacial layer including a first surface and a second surface, the first surface of the interfacial layer contacting the lower electrode, the first surface of the interfacial layer being closer to the halogen material compared to the second surface of the interfacial layer;
a capacitor insulating layer covering the interfacial layer and the supporter, the capacitor insulating layer contacting the second surface of the interfacial layer; and
an upper electrode covering the capacitor insulating layer.

2. The semiconductor device according to claim 1, wherein the halogen material is one of F, Cl, I, or Br.

3. The semiconductor device according to claim 1, wherein
the lower electrode comprises a halogen substance; and
the halogen substance of the lower electrode is closer to the interfacial layer than to a center of the lower electrode.

4. The semiconductor device according to claim 1, wherein:
the interfacial layer comprises a first metal material;
the lower electrode comprises a second metal material;
the supporter comprises a third metal material; and
an electron affinity of the first metal material and an electron affinity of the second metal material each are lower than an electron affinity of the third metal material.

5. The semiconductor device according to claim 4, wherein:
the first metal material is one of Nb, Ti, Zr, Hf, In, Al, Sr, Ba, Y, La, or Gd;
the second metal material is Ti; and
the third metal material is Si.

6. The semiconductor device according to claim 1, wherein the supporter comprises a halogen substance.

7. The semiconductor device according to claim 6, wherein the halogen substance of the supporter is a same element as the halogen material of the interfacial layer.

8. A semiconductor device comprising:
a substrate; and
a capacitor structure electrically connected to the substrate,
the capacitor structure including a lower electrode, a supporter supporting a sidewall of the lower electrode, an interfacial layer covering the lower electrode, a capacitor insulating layer covering the interfacial layer and the supporter, and an upper electrode covering the capacitor insulating layer,
the interfacial layer including first metal materials, first bonding materials bonded to the first metal materials, and halogen materials bonded to the first metal materials, the halogen materials of the interfacial layer defining a surface of the interfacial layer contacting the lower electrode,
the halogen materials being a halogen element.

9. The semiconductor device according to claim 8, wherein the first bonding materials are a nonmetal element that is different from the halogen materials of the interfacial layer.

10. The semiconductor device according to claim 9, wherein the first bonding materials are O.

11. The semiconductor device according to claim 8, wherein the halogen materials of the interfacial layer are closer to the lower electrode than to the capacitor insulating layer.

12. The semiconductor device according to claim 8, wherein a number of the first bonding materials in the interfacial layer is greater than a number of the halogen materials in the interfacial layer.

13. The semiconductor device according to claim 8, wherein an electron affinity of the first metal materials is lower than an electron affinity of a metal material in the supporter.

14. The semiconductor device according to claim 13, wherein the first metal materials are one of Nb, Ti, Zr, Hf, In, Al, Sr, Ba, Y, La, or Gd.

15. A semiconductor device comprising:
a substrate; and
a capacitor structure electrically connected to the substrate,
the capacitor structure including a lower electrode, a supporter supporting a sidewall of the lower electrode, an interfacial layer covering the lower electrode, a capacitor insulating layer covering the interfacial layer and the supporter, and an upper electrode covering the capacitor insulating layer,
the interfacial layer including a first metal material, a first bonding material bonded to the first metal material, and a halogen material bonded to the first metal material,
the lower electrode including a second metal material, a second bonding material bonded to the second metal material, and a halogen substance bonded to the second metal material,
the halogen material of the interfacial layer being closer to the lower electrode than to the capacitor insulating layer,
the halogen substance of the lower electrode being closer to the interfacial layer than to a center of the lower electrode.

16. The semiconductor device according to claim 15, wherein the halogen material of the interfacial layer and the halogen substance of the lower electrode are identical to each other.

17. The semiconductor device according to claim 15, wherein the first metal material and the second metal material are metal elements identical to each other.

18. The semiconductor device according to claim 17, wherein the first metal material and the second metal material are Ti.

19. The semiconductor device according to claim 15, wherein the first bonding material and the second bonding material are nonmetal elements different from each other.

20. The semiconductor device according to claim 15, wherein
the first bonding material is O, and
the second bonding material is N.

* * * * *